United States Patent
Hisada et al.

(10) Patent No.: US 9,603,248 B2
(45) Date of Patent: Mar. 21, 2017

(54) WIRING BOARD AND METHOD FOR MANUFACTURING THE SAME

(71) Applicant: IBIDEN CO., LTD., Ogaki-shi (JP)

(72) Inventors: Teruyoshi Hisada, Ogaki (JP); Takashi Nakane, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 63 days.

(21) Appl. No.: 13/779,944

(22) Filed: Feb. 28, 2013

(65) Prior Publication Data

US 2014/0041923 A1 Feb. 13, 2014

Related U.S. Application Data

(60) Provisional application No. 61/681,672, filed on Aug. 10, 2012.

(51) Int. Cl.
| | |
|---|---|
| *H05K 1/11* | (2006.01) |
| *H05K 3/46* | (2006.01) |
| *H05K 3/42* | (2006.01) |

(52) U.S. Cl.
CPC .......... *H05K 1/115* (2013.01); *H05K 3/4602* (2013.01); *H05K 3/429* (2013.01); *H05K 3/4652* (2013.01);
(Continued)

(58) Field of Classification Search
CPC . H05K 1/11; H05K 3/42; H05K 1/115; H05K 3/46; H05K 3/00; H05K 5/00;
(Continued)

(56) References Cited

U.S. PATENT DOCUMENTS

2004/0065960 A1 * 4/2004 Egitto .................. H01L 21/486
257/774

FOREIGN PATENT DOCUMENTS

| JP | 2001144442 A | * | 5/2001 |
| JP | 2002-026521 A | | 1/2002 |

(Continued)

*Primary Examiner* — Timothy Thompson
*Assistant Examiner* — Guillermo Egoavil
(74) *Attorney, Agent, or Firm* — Oblon, McClelland, Maier & Neustadt, L.L.P.

(57) ABSTRACT

A wiring board includes a board including a core, a conductive layer on the core, and a laminated structure over the core and conductive layer, and a stacked structure formed in the board and including a through-hole conductor through the core and a via conductor in the laminated structure. The through-hole conductor has though-hole portion through the core and land portion on the core, the laminated structure includes an insulation layer in which the via conductor is formed, the via conductor is stacked on the land portion such that the stacked structure including the through-hole and via conductors is formed through the core and the insulation layer, and the stacked structure is formed such that the through-hole portion has end connected to the land portion and the end has width set greater than width of bottom of the via conductor and smaller than width of top of the via conductor.

20 Claims, 21 Drawing Sheets

(52) U.S. Cl.
CPC ............... *H05K 2201/096* (2013.01); *H05K 2201/09509* (2013.01); *H05K 2201/09563* (2013.01); *H05K 2201/09827* (2013.01); *H05K 2201/09854* (2013.01); *H05K 2201/09863* (2013.01); *H05K 2203/0554* (2013.01)

(58) Field of Classification Search
CPC .. H05K 1/00; H05K 3/10; H05K 1/18; H05K 1/092; H05K 1/116; H05K 1/0298; H05K 3/0011; H05K 3/0038; H05K 3/0094; H05K 3/427; H05K 3/429; H05K 3/4069; H05K 3/4602; H05K 3/4611; H05K 3/4623; H05K 3/4652; H05K 3/4661; H05K 2201/096; H05K 2201/09509; H05K 2201/09545; H05K 2201/09563; H05K 2201/09827; H05K 2201/09854; H05K 2201/09863; H05K 2203/0554; H01L 23/5383; H01L 23/49838; H01L 23/49827; H01L 23/49822; Y10T 29/49165; Y10T 29/49144; Y10T 29/49117; Y10T 29/49126; Y10T 29/49124; Y10T 29/4913; Y10T 156/1056
USPC .......... 174/258, 266; 29/852, 829; 361/683; 257/E21.461, E29.112; 57/621; 427/97.3, 555; 438/479
See application file for complete search history.

(56) References Cited

U.S. PATENT DOCUMENTS

| | | | | |
|---|---|---|---|---|
| 2004/0136152 | A1* | 7/2004 | Mitsuhashi | H05K 3/4602 174/262 |
| (Continued) | | | | |
| 2006/0289202 | A1* | 12/2006 | Takeuchi | H01L 23/49827 174/262 |
| 2009/0100673 | A1* | 4/2009 | Yukiiri | H05K 3/421 29/846 |
| 2011/0180908 | A1* | 7/2011 | Naganuma | H01L 23/49838 257/621 |
| 2011/0240351 | A1* | 10/2011 | Wakita et al. | 174/258 |
| 2012/0304458 | A1* | 12/2012 | Yamauchi | H05K 3/0038 29/829 |
| 2013/0025925 | A1* | 1/2013 | Naganuma et al. | 174/262 |
| 2013/0284506 | A1* | 10/2013 | Zanma | H05K 1/115 174/260 |

FOREIGN PATENT DOCUMENTS

| | | | | |
|---|---|---|---|---|
| JP | 2001144442 | A | * | 5/2010 |
| JP | 2010192864 | A | * | 9/2010 |
| JP | 2010192864 | A | * | 9/2010 |

* cited by examiner

|  | 10-layer wiring board | 8-layer wiring board | 6-layer wiring board |
|---|---|---|---|
| 4th tier | 604 |  |  |
| 3rd tier | 694 | 599 |  |
| 2nd tier | 826 | 680 | 584 |
| 1st tier | 885 | 796 | 637 |
| core | 900 | 827 | 697 |

(MPa)

WIRING BOARD AND METHOD FOR MANUFACTURING THE SAME

CROSS-REFERENCE TO RELATED APPLICATIONS

The present application is based upon and claims the benefit of priority from U.S. Application No. 61/681,672, filed Aug. 10, 2012, the entire contents of which are incorporated herein by reference.

BACKGROUND OF THE INVENTION

Field of the Invention

The present invention relates to a wiring board with a stacked structure and to a method for manufacturing such a wiring board.

Description of Background Art

Japanese Laid-Open Patent Publication No. 2002-26521 describes a wiring board having a stacked structure which is formed with multiple via conductors and their respective via-conductor lands. The contents of Japanese Laid-Open Patent Publication No. 2002-26521 are incorporated into the present application. The entire contents of this publication are incorporated herein by reference.

SUMMARY OF THE INVENTION

According to one aspect of the present invention, a wiring board includes a board structure including a core insulation layer, a first conductive layer formed on a first surface of the core insulation layer, and a first laminated structure formed over the first surface of the core insulation layer and the first conductive layer, and a stacked conductor structure formed in the board structure and including a through-hole conductor penetrating through the core insulation layer and a via conductor formed in the first laminated structure. The through-hole conductor has a though-hole portion formed in a through hole penetrating through the core insulation layer and a first land portion formed on the first surface of the core insulation layer, the first conductive layer includes the first land portion of the through-hole conductor, the first laminated structure includes an interlayer insulation layer in which the via conductor is formed, the via conductor in the first laminated structure is stacked on the first land portion of the through-hole conductor such that the stacked conductor structure including the through-hole conductor and the via conductor is formed through the core insulation layer and the interlayer insulation layer of the first laminated structure, and the stacked conductor structure is formed such that the through-hole portion of the through-hole conductor has a first end portion connected to the first land portion of the through-hole conductor and that the first end portion of the through-hole portion has a width which is set greater than a width of the bottom surface of the via conductor connected to the first land portion of the through-hole conductor and smaller than a width of the top surface of the via conductor in the first laminated structure.

According to another aspect of the present invention, a method for manufacturing a wiring board includes forming a through hole penetrating through a core insulation layer, forming a through-hole portion of a through-hole conductor in the through hole of the core insulation layer, forming on a first surface of the core insulation layer a first conductive layer including a first land portion of the through-hole conductor, forming over the first surface of the core insulation layer and the first conductive layer a first laminated structure including an interlayer insulation layer, and forming a via conductor in the interlayer insulation layer of the first laminated structure such that the via conductor is stacked on the first land portion of the through-hole conductor and forms a stacked conductor structure including the through-hole conductor penetrating through the core insulation layer and the via conductor in the interlayer insulation layer of the first laminated structure. The stacked conductor structure is formed such that the through-hole portion of the through-hole conductor has a first end portion connected to the first land portion of the through-hole conductor and that the first end portion of the through-hole portion has a width which is set greater than a width of the bottom surface of the via conductor connected to the first land portion of the through-hole conductor and smaller than a width of the top surface of the via conductor in the first laminated structure.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
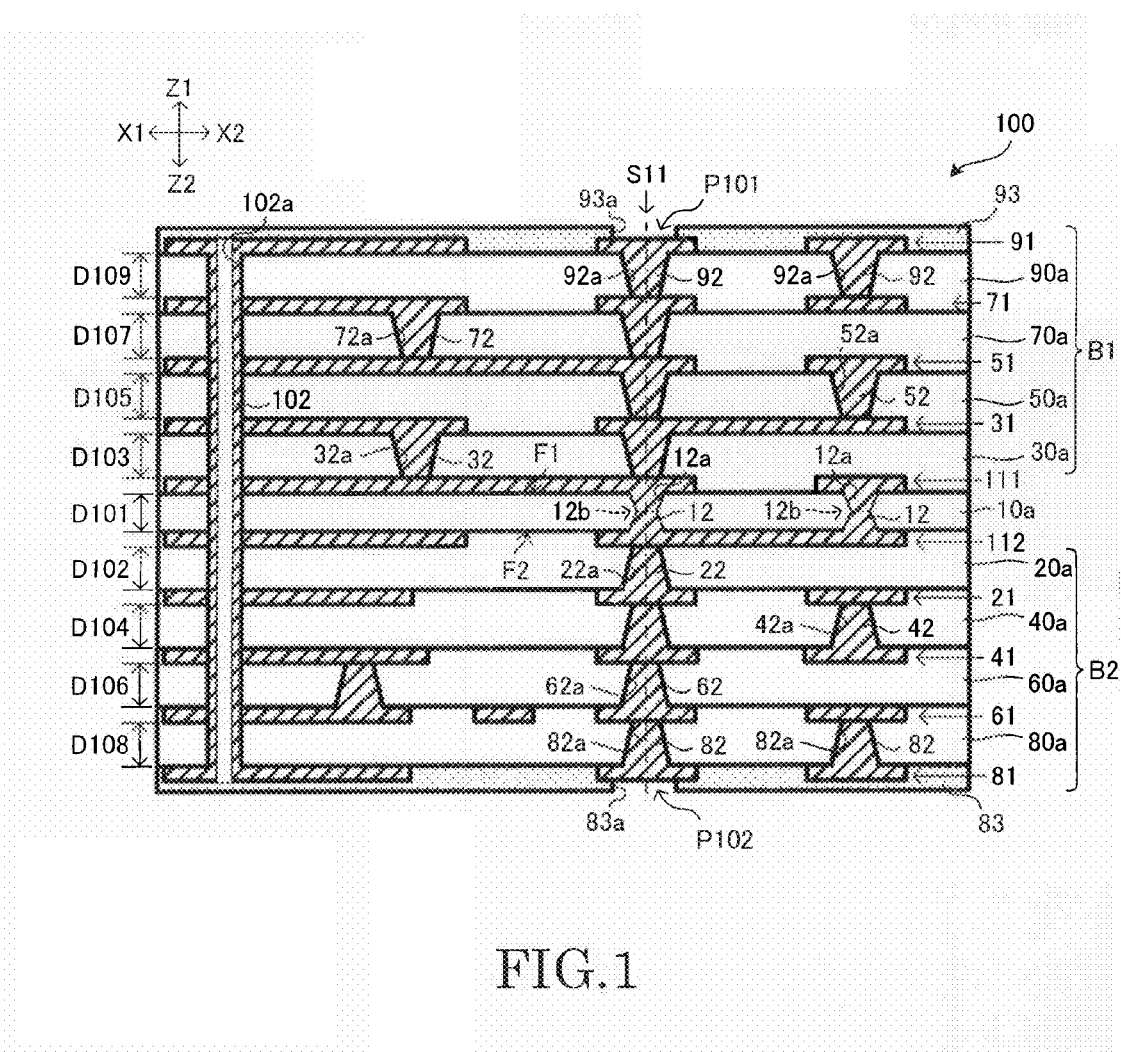
FIG. 1 is a cross-sectional view of a wiring board according to an embodiment of the present invention.

The embodiments will now be described with reference to the accompanying drawings, wherein like reference numerals designate corresponding or identical elements throughout the various drawings.

Arrows (Z1, Z2) in the drawings respectively indicate lamination directions of a wiring board (or thickness directions of the wiring board) corresponding to normal lines to main surfaces (upper and lower surfaces) of the wiring board. On the other hand, arrows (X1, X2) and (Y1, Y2) respectively indicate directions perpendicular to lamination directions (or a side direction of each layer). Main surfaces of the wiring board are on the X-Y plane. Also, side surfaces of the wiring board are on the X-Z plane or the Y-Z plane. In lamination directions, the side closer to the core of the wiring board is referred to as a lower layer (or an inner layer), and the side farther from the core as an upper layer (or an outer layer). An innermost via conductor is located closest to the core, and an outermost via conductor is located farthest from the core.

A conductive layer is formed with one or multiple conductive patterns. A conductive layer may include a conductive pattern that forms an electrical circuit, such as wiring (including ground), a pad, a land or the like, or may include a planar conductive pattern or the like that does not form an electrical circuit.

Opening portions include notches, slits and so forth in addition to holes and grooves. Holes include non-penetrating holes as well as penetrating holes. Holes include via holes and through holes.

A via hole means, for example, a hole which is formed by making a hole where a conductive layer is formed on one side of an insulation layer (mainly, a lower conductive layer) and which reaches the conductive layer from the other side of the insulation layer. Since the conductor in a via hole (hereinafter referred to as a via conductor) is formed when a conductive layer is present on one side of an insulation layer, the via conductor is not contiguous to a conductive layer at least on one side of the insulation layer, and an interface is formed between them. On the other hand, a through hole means a hole which is formed to penetrate through an insulation layer and a conductive layer when such a conductive layer is present on one side or both sides of the insulation layer. The conductor formed in a through hole (hereinafter referred to as a through-hole conductor) is usually formed by plating or the like when conductive layers on both sides of the insulation layer are formed. Thus, the through-hole conductor and the conductive layers on both sides of the insulation layer are at least partially contiguous.

A land is a conductor formed on a hole (such as a via hole) or its periphery, and at least part of it is formed to be integrated with the conductor inside the hole (via conductor, for example).

The bottom of a via conductor is positioned opposite the land. When lands (or bottoms) of via conductors are positioned on the same side, they are referred to as via conductors facing the same direction. In FIG. 1, for example, via conductors formed in laminated section (B1) (via conductors (32, 52, 72, 92)) each have a land on the Z1 side. Thus, those via conductors correspond to via conductors facing the same direction. Also, via conductors formed in laminated section (B2) (via conductors (22, 42, 62, 82)) each have a land on the Z2 side. Thus, those via conductors correspond to via conductors facing the same direction. On the other hand, via conductors in laminated section (B1) and via conductors in laminated section (B2) have different land positions (the Z1 side or Z2 side). Therefore, via conductors in laminated section (B1) and via conductors in laminated section (B2) correspond to via conductors facing opposite directions from each other.

Stacking means situations where a via conductor is formed on the land of a through-hole conductor or a via conductor positioned in its lower layer. Namely, unless the bottom of a via conductor is positioned outside the land of a through-hole conductor or a via conductor in its lower layer, they are stacked.

Connection includes situations with seams as well as seamless situations. Situations with seams mean those such as where two objects formed separately are joined using an adhesive or the like, for example. Seamless situations mean those such as where two objects are formed to be contiguous (integrated) and there is nothing else between them, for example.

Plating includes dry plating such as PVD (physical vapor deposition) and CVD (chemical vapor deposition) as well as wet plating such as electrolytic plating. Light is not limited to visible light, and includes electromagnetic waves with short wavelengths such as UV rays and X rays as well as electromagnetic waves with long wavelengths such as infrared rays.

Unless otherwise specified, the "width" of a hole or a column (protrusion) indicates the diameter if its cross section is a circle, and $2\sqrt{\text{(cross section}/\pi)}$ if it is other than a circle. The depth of a recess indicates the maximum value (the value measured at the deepest portion). However, measurements are not limited to the above definitions if clearly indicated otherwise.

As shown in FIG. 1, wiring board 100 of the present embodiment includes core insulation layer (10a), insulation layers (20a, 30a, 40a, 50a, 60a, 70a, 80a, 90a), conductive layers (111, 112, 21, 31, 41, 51, 61, 71, 81, 91), through-hole conductor 12 and via conductors (22, 32, 42, 52, 62, 72, 82, 92). Wiring board 100 is a multilayer printed wiring board. In the following, one of the upper and lower surfaces (two main surfaces) of core insulation layer (10a) is referred to as surface (F1) and the other as surface (F2).

In the present embodiment, core insulation layer (10a) has surface (F1) (first surface) and its opposing surface (F2) (second surface). Conductive layer 111 (first conductive layer) is formed on surface (F1) of core insulation layer (10a), and laminated section (B1) (first laminated section) is formed on surface (F1) of core insulation layer (10a) and on conductive layer 111. Also, conductive layer 112 (second conductive layer) is formed on surface (F2) of core insulation layer (10a), and laminated section (B2) (second laminated section) is formed on surface (F2) of core insulation layer (10a) and on conductive layer 112.

Laminated sections (B1, B2) are each formed with four sets of interlayer insulation layers and conductive layers. Namely, four insulation layers (30a, 50a, 70a, 90a) (each an interlayer insulation layer) and four conductive layers (31, 51, 71, 91) are alternately laminated on surface (F1) of core insulation layer (10a) and on conductive layer 111. Also, four insulation layers (20a, 40a, 60a, 80a) (each an interlayer insulation layer) and four conductive layers (21, 41, 61, 81) are alternately laminated on surface (F2) of core insulation layer (10a) and on conductive layer 112.

Conductive layers (111, 112, 21, 31, 41, 51, 61, 71, 81, 91) each have, for example, wiring that forms an electric circuit, a land, a planar conductive pattern to enhance the strength of wiring board 100, and so forth.

Solder resists (83, 93) are formed respectively on conductive layers (81, 91) (each an outermost conductive layer). However, opening portions (83a, 93a) are formed respectively in solder resists (83, 93). Thus, a predetermined portion of conductive layer 81 (the portion corresponding to opening portion (83a)) is exposed without being covered by solder resist 83 and becomes pad (P102). Also, a predetermined portion of conductive layer 91 (the portion corresponding to opening portions (93a)) becomes pad (P101). Pad (P101) becomes an external connection terminal for an electrical connection with another wiring board, for example, and pad (P102) becomes an external connection terminal for mounting an electronic component, for example. However, those are not the only options, and pads (P101, P102) may be used for any other purposes.

In the present embodiment, core insulation layer (10a) corresponds to the core substrate of wiring board 100. In wiring board 100, conductive layers positioned on different layers are electrically connected to each other by a via conductor formed in the insulation layer positioned as their interlayer (interlayer insulation layer). Conductive layers formed on both surfaces of core insulation layer (10a) (conductive layers (111, 112)) are electrically connected to each other by through-hole conductor 12 formed in core insulation layer (10a).

Through hole (12a) is formed in core insulation layer (10a) to penetrate through core insulation layer (10a), and a conductor (such as copper plating) is filled in through hole (12a). The conductor in through hole (12a) forms through-hole conductor 12.

In the present embodiment, through-hole conductor 12 is shaped like an hourglass. Through-hole conductor 12 has end surface (121c) (first end surface) and its opposing end surface (121f) (second end surface), and the width of through-hole conductor 12 becomes smaller as it goes farther from end surfaces (121c, 121f) respectively, and becomes smallest at narrowed portion (121b). The planar shapes (on the X-Y plane) of end surfaces (121c, 121f) and narrowed portion (121b) are circular, for example.

Via holes (22a, 32a, 42a, 52a, 62a, 72a, 82a, 92a) are respectively formed in insulation layers (20a, 30a, 40a, 50a, 60a, 70a, 80a, 90a), and conductor (such as copper plating) is filled in each via hole. The conductors in via holes (22a, 32a, 42a, 52a, 62a, 72a, 82a, 92a) form via conductors (22, 32, 42, 52, 62, 72, 82, 92) respectively.

Via conductors (22, 32, 42, 52, 62, 72, 82, 92) are each shaped to be a tapered column (truncated cone) tapering with a diameter decreasing toward core insulation layer (10a), for example. However, that is not the only option, and the shape of each via conductor may be determined freely.

Through hole (102a) is formed in wiring board 100 to penetrate through all the layers, and through-hole conductor 102 made of copper plating (such as a conformal conductor), for example, is formed on the wall surface of through hole (102a). Through hole (102a) penetrates through wiring board 100 in direction Z (lamination direction). The opening shape of through hole (102a) is elliptical, for example. Through hole (102a) is positioned on the periphery of wiring board 100, for example. Through-hole conductor 102 may be electrically connected to a ground line or the like of wiring board 100, or may be electrically independent by being insulated from all the other conductors. The number of through holes (102a), the shapes of their openings, their positioning or the like may be determined freely. Through hole (102a) may be omitted unless required.

Wiring board 100 of the present embodiment has stacked structure (S11). Stacked structure (S11) is formed with a through-hole conductor, via conductors and their lands. In particular, stacked structure (S11) is a full-stack structure, where a through-hole conductor and via conductors in all the layers are stacked. In stacked structure (S11), an adjacent through-hole conductor and via conductor or adjacent via conductors are adhered to (make contact with) each other and are electrically connected. Accordingly, wiring space is easier to secure, enhancing the design flexibility of wiring patterns. Also, since wiring in direction X or direction Y may be omitted, the wiring length of the interlayer connection is reduced.

In the present embodiment, axes in direction Z substantially correspond to each other in the through-hole conductor and all of the via conductors of stacked structure (S11). Here, the axes in direction Z of the through-hole conductor and the via conductors correspond to a line in direction Z that passes through the gravity centers (centers if they are circles) in the X-Y cross sections of the through-hole conductor and via conductors.

Stacked structure (S11) is extended along direction Z to electrically connect conductive layer 81 (outermost conductive layer on one side) and conductive layer 91 (outermost conductive layer on the other side) in wiring board 100. FIG. 1 shows one stacked structure (S11); however, the positioning and number of stacked structures are not limited specifically. Stacked structure (S11) may be formed in the periphery of wiring board 100 or may be positioned in the center of wiring board 100.

Figure 2:
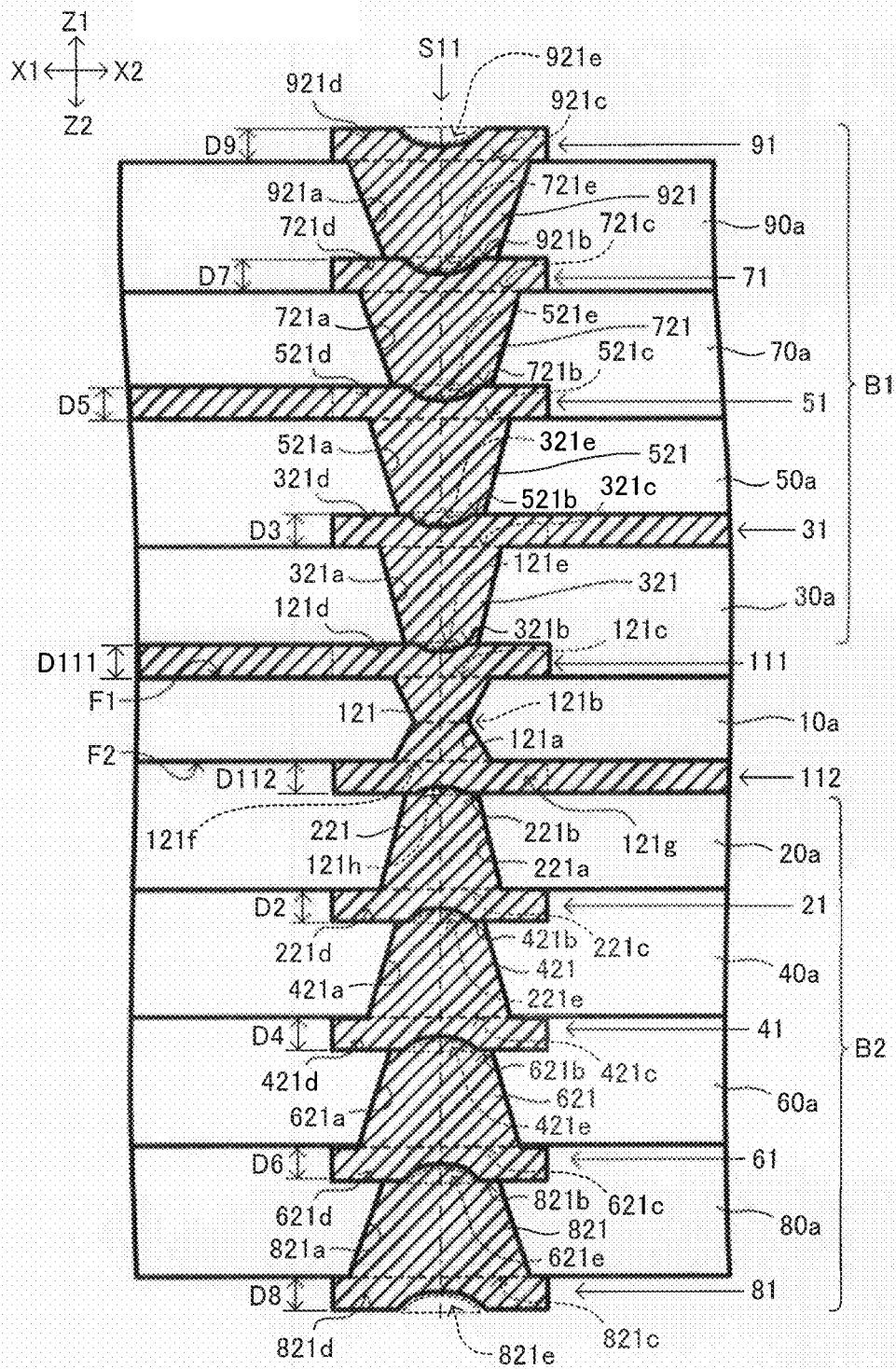
FIG. 2 is an enlarged view showing a stacked structure in the wiring board shown in FIG. 1.

FIG. 2 shows an enlarged view of stacked structure (S11). Via conductors of stacked structure (S11) are formed in core insulation layer (10a) and laminated sections (B1, B2). In the following, among through-hole conductors 12, the through-hole conductor of stacked structure (S11) is referred to as through-hole conductor 121. Also, among via conductors (22, 32, 42, 52, 62, 72, 82, 92), those via conductors of stacked structure (S11) are referred to as via conductors (221, 321, 421, 521, 621, 721, 821, 921).

As shown in FIG. 2, through-hole conductor 121 is made of the conductor in through hole (121a) (such as copper plating). Also, via conductors (221, 321, 421, 521, 621, 721, 821, 921) are respectively made of the conductors (such as copper plating) in via holes (221a, 321a, 421a, 521a, 621a, 721a, 821a, 921a).

Through-hole conductor 121 of stacked structure (S11) is connected to land (121d) (first land) which is included in conductive layer 111 (first conductive layer) on end surface (121c) on one of its sides, while connected to land (121g) (second land) which is included in conductive layer 112 (second conductive layer) on end surface (121f) on the other side. Upper-end surfaces (221c, 321c, 421c, 521c, 621c, 721c, 821c, 921c) of the via conductors are connected to their lands (221d, 321d, 421d, 521d, 621d, 721d, 821d, 921d) respectively. In addition, bottoms (221b, 321b, 421b, 521b, 621b, 721b, 821b, 921b) of the via conductors are connected to the upper surfaces of lands (121g, 121d, 221d, 321d, 421d, 521d, 621d, 721d) respectively.

In the present embodiment, all of the via conductors of stacked structure (S11) are connected to their lands on the upper-end surfaces. Also, lands (221d, 321d, 421d, 521d, 621d, 721d, 821d, 921d) of the via conductors of stacked structure (S11) are included in conductive layers (21, 31, 41, 51, 61, 71, 81, 91) respectively.

In the present embodiment, recesses (121e, 121h, 221e, 321e, 421e, 521e, 621e, 721e, 821e, 921e) are formed on surfaces of lands (121d, 121g, 221d, 321d, 421d, 521d, 621d, 721d, 821d, 921d) respectively. Regarding stacked structure (S11) of the present embodiment, if the lands are positioned closer to outermost lands (821d, 921d), their recesses have greater depth and width. The recesses may be shaped like a dome (partial sphere), a truncated cone (tapered column), or a rectangle (or a cube).

As shown in FIG. 2, stacked structure (S11) is made up of through-hole conductor 121 in core insulation layer (10a), the first stacked portion in laminated section (B1) (first laminated section) formed by stacking via conductors (321, 521, 721, 921) on land (121d) (first land) of through-hole conductor 121, and the second stacked portion in laminated section (B2) (second laminated section) formed by stacking via conductors (221, 421, 621, 821) on land (121g) (second land) of through-hole conductor 121. The first stacked portion includes four via conductors facing the same direction formed in laminated section (B1) (via conductors (321, 521, 721, 921)), and the second stacked portion includes four via conductors facing the same direction (opposite direction to those in the first stacked portion) formed in laminated section (B2) (via conductors (221, 421, 621, 821)).

Figure 3:
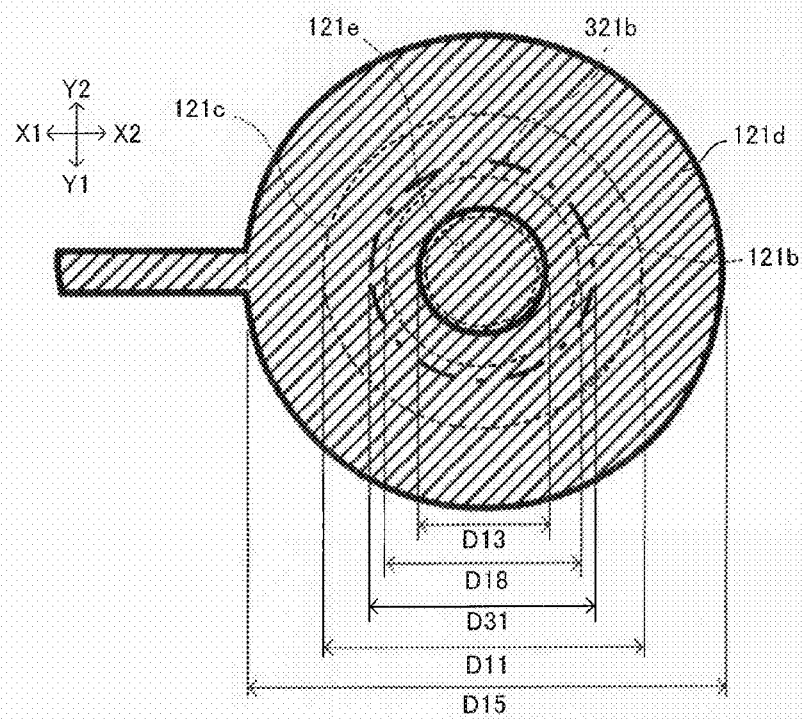
FIG. 3 is a plan view illustrating the structure of a through-hole conductor in the stacked structure shown in FIG. 2.

In through-hole conductor 121, narrowed portion (121b), end surface (121c), land (121d) and recess (121e) substantially have the relationships (measurements, positioning or the like) shown in FIG. 3.

As shown in FIG. 3, regarding through-hole conductor 121, width (D13) of recess (121e), width (D18) of narrowed portion (121b), width (D11) of end surface (121c) and width (D15) of land (121d) are set in the order of widths (D13), (D18), (D11) and (D15) starting with the smallest. In through-hole conductor 121, recess (121e), narrowed portion (121b), end surface (121c) and land (121d) are formed for their planar shapes (X-Y plane) to be concentric circles, for example. In addition, wiring integrated with land (121d), for example, is included in conductive layer 111. Such wiring is connected to power or ground, for example. However, that is not the only option, and such wiring may be omitted unless necessary.

Figure 4:
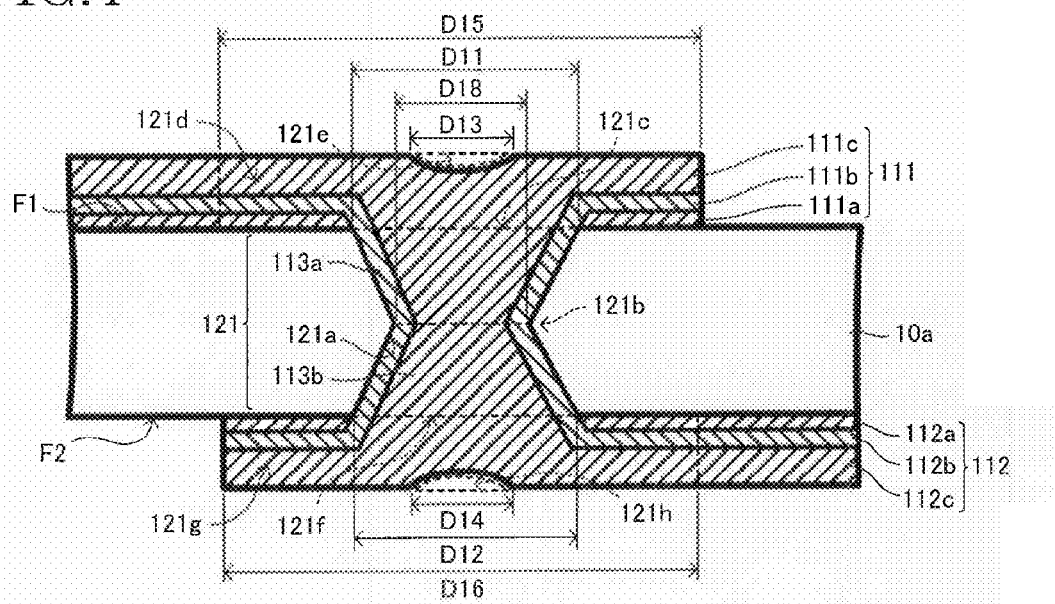
FIG. 4 is a cross-sectional view illustrating the structure of a through-hole conductor in the stacked structure shown in FIG. 2.

FIG. 3 shows the structure of the side from narrowed portion (121b) to land (121d) of through-hole conductor 121. However, the structure of the side from narrowed portion (121b) to land (121g) of through-hole conductor 121 is the same as shown in FIG. 3, for example. In the present embodiment, the structure on the land (121d) side of through-hole conductor 121 and the structure on the land (121g) side are set substantially symmetrical at narrowed portion (121b) (X-Y plane), for example, as shown in FIG. 4. For example, positions (XY coordinates) of end surface (121f), land (121g) and recess (121h) are substantially the same as those of end surface (121c), land (121d) and recess (121e) in regard to narrowed portion (121b). In addition, the measurements and shapes of end surface (121f), land (121g) and recess (121h) are substantially the same as those of end surface (121c), land (121d) and recess (121e), for example. Namely, width (D12) of end surface (121f), width (D14) of recess (121h) and width (D16) of land (121g) are substantially the same, for example, as width (D11) of end surface (121c), width (D13) of recess (121e) and width (D15) of land (121d) respectively.

A description is provided for the structure of through-hole conductor 121 of stacked structure (S11) according to the present embodiment by referring to FIG. 4.

In the present embodiment, conductive layer 111 (including land (121d)) is formed with metal foil (111a) (such as copper foil), electroless copper-plated film (111b), for example, and electrolytic copper plating (111c), for example, as shown in FIG. 4. Metal foil (111a), electroless plated film (111b) and electrolytic plating (111c) of conductive layer 111 are laminated in that order on surface (F 1) of core insulation layer (10a).

Conductive layer 112 (including land (121g)) is formed with metal foil (112a) (such as copper foil), electroless copper-plated film (112b), for example, and electrolytic copper plating (112c), for example. Metal foil (112a), electroless plated film (112b) and electrolytic plating (112c) of conductive layer 112 are laminated in that order on surface (F2) of core insulation layer (10a).

Also, through-hole conductor 121 is formed with electroless copper-plated film (113a), for example, and electrolytic copper plating (113b), for example. Electroless plated film (113a) and electrolytic plating (113b) of through-hole conductor 121 are laminated in that order on the wall surface of through hole (121a). Electrolytic plating (113b) is filled inside electroless plated film (113a) in through hole (121a).

In through-hole conductor 121 and its lands (121d, 121g), electroless plated films (111b, 112b, 113a) are formed to be contiguous (integrated) with each other, and electrolytic platings (111c, 112c, 113b) are formed to be contiguous (integrated) with each other. Namely, part of through-hole conductor 121 is connected to conductive layers (111, 112) (in particular, lands (121d, 121g)) on both sides of core insulation layer (10a).

Figure 5:
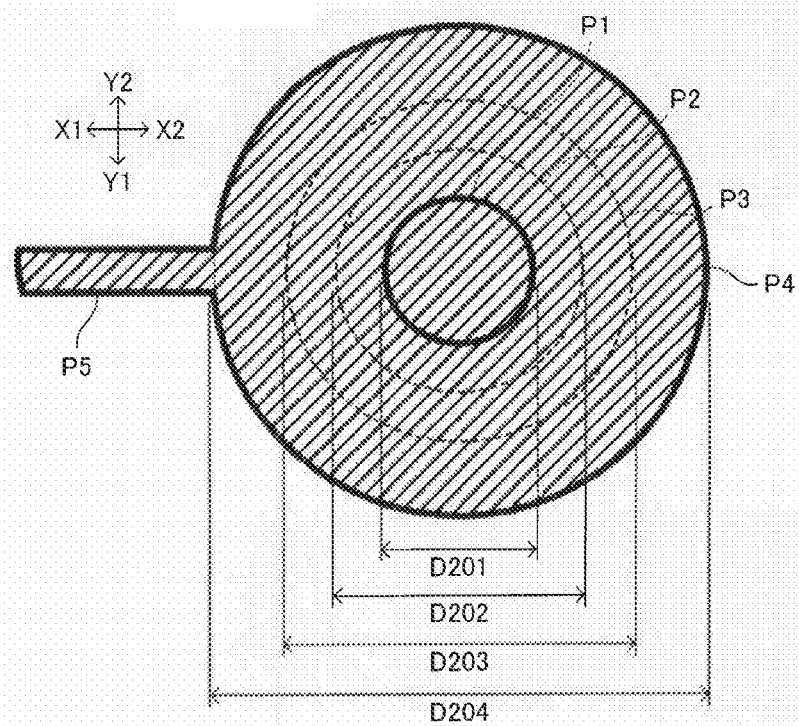
FIG. 5 is a plan view illustrating the structure of each via conductor in the stacked structure shown in FIG. 2.

In any of the via conductors that form stacked structure (S11), the upper-end surface and the bottom as well as the land and its recess are substantially in the relationships (measurements, positions or the like) shown in FIG. 5. In FIG. 5, (P1) is the recess formed in a land (hereinafter referred to as recess (P1)), (P2) is the bottom of a via hole (hereinafter referred to as bottom (P2)), (P3) is the upper-end surface of a via conductor (hereinafter referred to as upper-end surface (P3)), (P4) is a land (hereinafter referred to as land (P4)), and (P5) is wiring connected to the land (in particular, integrated with the land) (hereinafter referred to as wiring (P5)).

As shown in FIG. 5, regarding a via conductor, width (D201) of recess (P1), width (D202) of bottom (P2), width (D203) of upper-end surface (P3) and width (D204) of land (P4) are set in the order of widths (D201), (D202), (D203) and (D204) starting with the smallest. In a via conductor, recess (P1), bottom (P2), upper-end surface (P3) and land (P4) are formed for their planar shapes (X-Y plane) to be concentric circles, for example. Wiring (P5) is connected to power or ground, for example. However, that is not the only option, and wiring (P5) may be omitted unless necessary.

Figure 6:
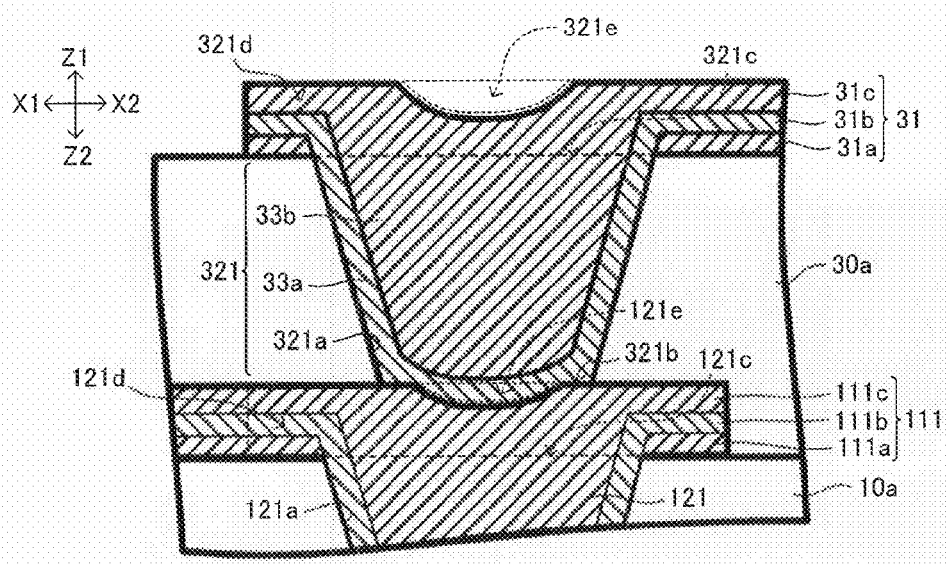
FIG. 6 is a cross-sectional view illustrating the structure of each via conductor in the stacked structure shown in FIG. 2.

FIG. 6 is a view illustrating the structure of each via conductor that forms stacked structure (S11) according to the present embodiment. FIG. 6 shows via conductor 321 as an example; however, all the via conductors of stacked structure (S11) have substantially the same structure.

In the present embodiment, each conductive layer of laminated sections (B1, B2) of wiring board 100 is formed with metal foil (lower layer), electroless plated film (middle layer) and electrolytic plating (upper layer). In particular, as shown in FIG. 6, for example, conductive layer 31 is formed with metal foil (31a) (such as copper foil), electroless copper-plated film (31b), for example, and electrolytic copper plating (31c), for example. Metal foil (31a), electroless plated film (31b) and electrolytic plating (31c) of conductive layer 31 are laminated in that order on insulation layer (30a).

In addition, via conductor 321 is formed with electroless copper-plated film (33a), for example, and electrolytic copper plating (33b), for example. Electroless plated film (33a) and electrolytic plating (33b) of via conductor 321 are laminated in that order on the bottom and wall surfaces of via hole (321a). Electrolytic plating (33b) is filled inside electroless plated film (33a) in via hole (321a).

In via conductor 321 and its land (321d), electroless plated films (31b, 33a) are formed contiguous (integrated) to each other, and electrolytic platings (31c, 33b) are formed contiguous (integrated) to each other. Regarding via conductor 321, part of it is contiguous to land (321d) (conductive layer 31) while part of it is not contiguous to land (121d) (conductive layer 111). Namely, an interface is formed between bottom (321b) of via conductor 321 and the upper surface of land (121d).

In the present embodiment, width (D11) of end surface (121c) of through-hole conductor 121 is set greater than width (D31) of bottom (321b) of via conductor 321 (lowermost via conductor of laminated section (B1) or the first stacked portion) (D11>D31), and is set smaller than width (D32) of upper-end surface (321c) of via conductor 321 (D11<D32). Width (D12) of end surface (121f) of through-hole conductor 121 is set greater than width (D21) of bottom (221b) of via conductor 221 (lowermost via conductor of laminated section (B2) or the second stacked portion) (D12>D21), and is set smaller than width (D22) of upper-end surface (221c) of via conductor 221 (D12<D22).

Width (D18) of the narrowest portion of through-hole conductor 121 (narrowed portion (121b)) is set smaller than width (D21) of bottom (221b) of via conductor 221 (D18<D21), and is set smaller than width (D31) of bottom (321b) of via conductor 321 (D18<D31).

Width (D13) of recess (121e) and width (D14) of recess (121h) are each set smaller than width (D18) of narrowed portion (121b) (D13<D18, D14<D18), for example. However, that is not the only option, and width (D13) of recess (121e) and width (D14) of recess (121h) may each be the same as width (D18) of narrowed portion (121b) or greater than width (D18).

In via conductor 321 of the present embodiment, width (D31) of bottom (321b), width (D32) of upper-end surface (321c), and width (D33) of recess (321e) are set in the order of widths (D33), (D31) and (D32) starting with the smallest. In addition, width (D31) of bottom (321b) of via conductor 321 is set greater than width (D13) of recess (121e) of through-hole conductor 121. Also, width (D51) of bottom (521b) of via conductor 521 is set greater than width (D33) of recess (321e) of via conductor 321.

Meanwhile, regarding via conductor 221, width (D21) of bottom (221b), width (D22) of upper-end surface (221c), and width (D23) of recess (221e) are set in the order of widths (D23), (D21) and (D22) starting with the smallest. Width (D21) of bottom (221b) of via conductor 221 is set greater than width (D14) of recess (121h) of through-hole conductor 121. Also, width (D41) of bottom (421b) of via conductor 421 is set greater than width (D23) of recess (221e) of via conductor 221.

In the present embodiment, via conductors (321, 521, 721, 921) of the first stacked portion of stacked structure (S11) and via conductors (221, 421, 621, 821) of the second stacked portion of stacked structure (S11) have structures (shapes, measurements and positions) symmetrical at through-hole conductor 121 as shown in FIG. 2. Via conductors positioned in the same tiers have structures (shapes, measurements and positions) the same as each other. In the following, positions of via conductors in the first and second stacked portions are referred to as first tiers (via conductors (321, 221)), second tiers (via conductors (521, 421)), third tiers (via conductors (721, 621)) and fourth tiers (via conductors (921, 821)) in that order starting with the lowest respectively.

As shown in FIG. 2, the width of narrowed portion (121b) of through-hole conductor 121 and the bottom width of each via conductor of stacked structure (S11) are set in the order of narrowed portion (121b), bottoms (321b), (521b), (721b) and (921b) starting with the smallest. Also, the width of end surface (121c) of through-hole conductor 121 and the width of an upper-end surface of each via conductor of the first stacked portion are set in the order of end surface (121c), upper-end surfaces (321c), (521c), (721c) and (921c) starting with the smallest. The width of a recess formed on each land (121d), (321d), (521d), (721d) or (921d) is set in the order of recessed portions (121e), (321e), (521e), (721e) and (921e) starting with the smallest.

Meanwhile, the width of narrowed portion (121b) of through-hole conductor 121 and the bottom width of each via conductor of stacked structure (S11) are set in the order of narrowed portion (121b), bottoms (221b), (421b), (621b) and (821b) starting with the smallest. The width of end surface (121f) of through-hole conductor 121 and the width of an upper-end surface of each via conductor of the second stacked portion are set in the order of end surface (121f), upper-end surfaces (221c), (421c), (621c) and (821c) starting with the smallest. The width of a recess formed on each land (121g), (221d), (421d), (621d) or (821d) is set in the order of recessed portions (121h), (221e), (421e), (621e) and (821e) starting with the smallest.

Lands (121d, 121g, 221d, 321d, 421d, 521d, 621d, 721d, 821d, 921d) connected respectively to through-hole conductor 121 and via conductors have the same width as each other, for example. In the present embodiment, all the lands in stacked structure (S11) have the same width as each other. However, that is not the only option, and stacked structure (S11) may be formed with multiple lands having different widths from each other.

Figure 8:
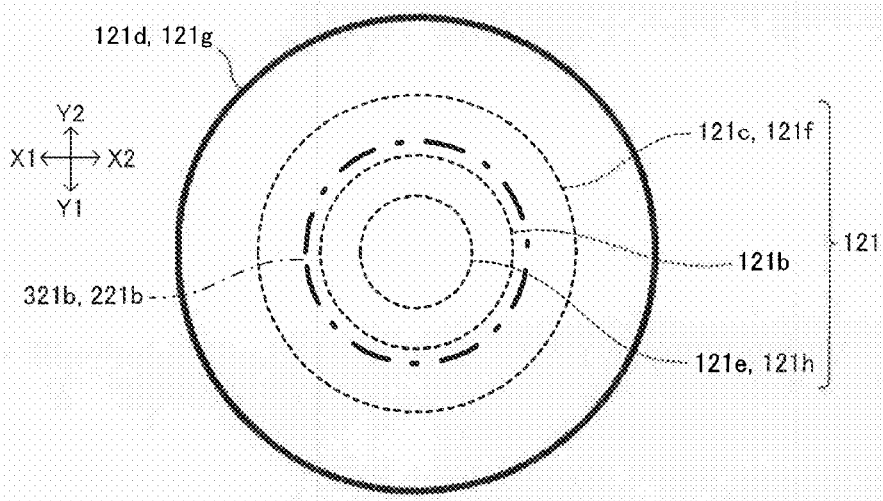
FIG. 8 is a view illustrating positional relationships of a through-hole conductor and the via conductors stacked on both of its surfaces in the stacked structure shown in FIG. 2.

In the present embodiment, through-hole conductor 121 is formed in such a way that a set of end surfaces (121c, 121f) positioned in a lamination direction (direction Z) overlap (substantially correspond to) each other when projected onto the X-Y plane, as shown in FIG. 8, for example. In addition, lands (121d, 121g) are also formed to overlap (substantially correspond to) each other when projected on the X-Y plane, for example. Recesses (121e, 121h) are also formed to overlap (substantially correspond to) each other when projected on the X-Y plane, for example.

Via conductor 321 is stacked on land (121d) of through-hole conductor 121, and via conductor 221 is stacked on land (121g) of through-hole conductor 121. Bottom (321b) of via conductor 321 and bottom (221b) of via conductor 221 are positioned to overlap (substantially correspond to) each other when projected on the X-Y plane, for example. In addition, bottoms of via conductors in the same tiers of the first and second stacked portions of stacked structure (S11) are positioned to overlap (substantially correspond to) each other when projected on the X-Y plane, for example.

Figure 9:
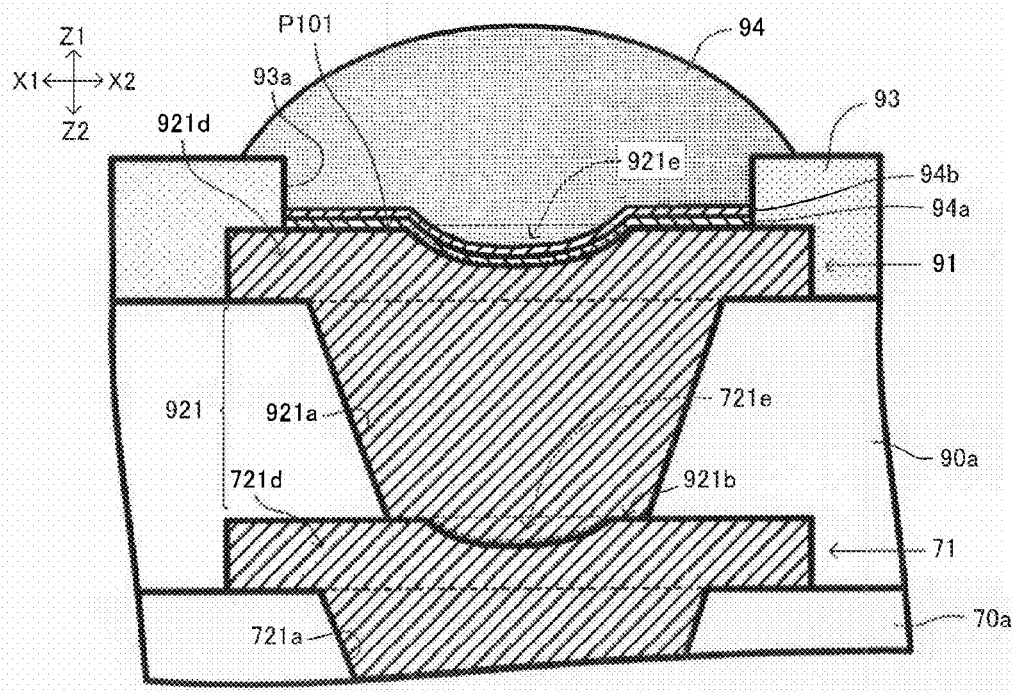
FIG. 9 is a view illustrating an example where solder is formed on the pad of an outermost land of the stacked structure according to an embodiment of the present invention.

In wiring board 100 of the present embodiment, land (921d) of via conductor 921 in the outermost tier of stacked structure (S11) (FIG. 2) makes pad (P101) (FIG. 1). Anticorrosion layer (94a) (lower layer) made of Ni or the like and anticorrosion layer (94b) (upper layer) made of Au or the like are formed on the surface of pad (P101) as shown in FIG. 9, for example. Anticorrosion layers (94a, 94b) are each formed by electrolytic plating, sputtering or the like. Then, solder 94 is formed by application, printing or the like on anticorrosion layer (94b). In wiring board 100 of the present embodiment, since the width of an outermost via conductor (via conductor 921) is set great, it is easier to reduce electrical resistance of the external connection portion (vicinity of via conductor 921). Also, since deeper recess (921e) is formed in land (921d), solder 94 is allowed to enter land (921d) through recess (921e) of land (921d). As a result, connection strength, and subsequently connection reliability, is enhanced between land (921d) and solder 94.

Here, by performing an OSP treatment, an anticorrosion layer made of organic protective film may be formed instead of anticorrosion layers (94a, 94b). In addition, anticorrosion layers are not always required, and may be omitted unless necessary.

Figures 10A, 10B:
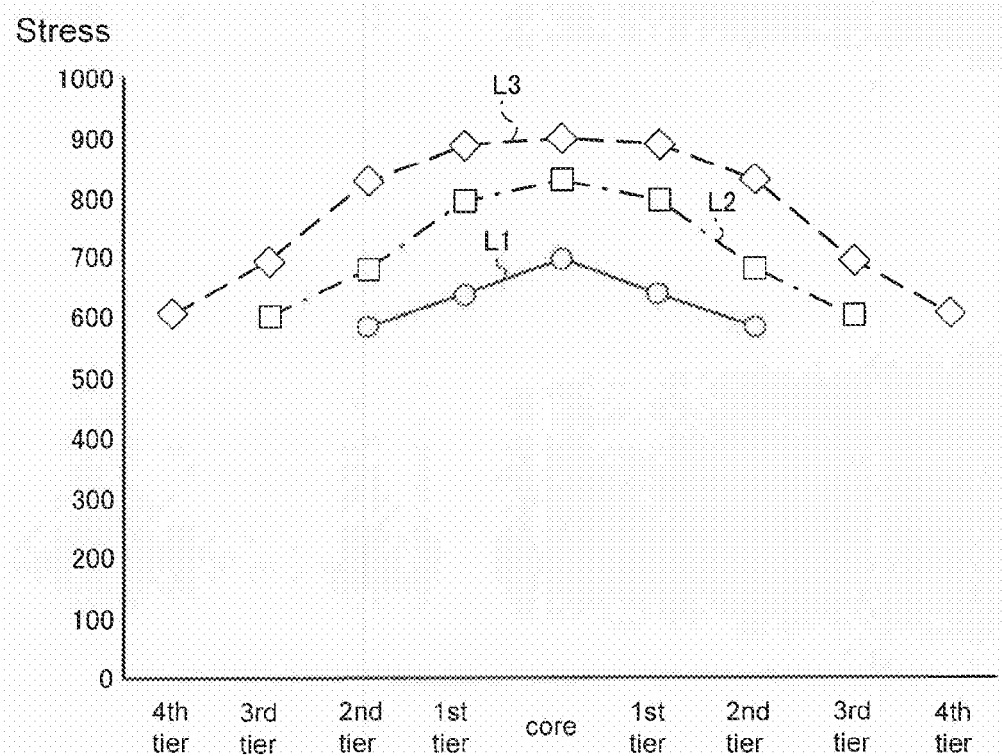
FIG. 10A is a graph showing the results of a simulation conducted on stresses exerted on six-layer, eight-layer and 10-layer wiring boards.
FIG. 10B is a table showing numeric values of the simulation results shown in FIG. 10A.

FIGS. 10A and 10B show the simulation results of stresses (especially thermal stresses during heat cycles) exerted on wiring boards having six layers, eight layers or 10 layers (hereinafter referred to as a six-layer wiring board, eight-layer wiring board or 10-layer wiring board) with a full-stack structure. In FIG. 10A, line (L1) shows data of the six-layer wiring board, line (L2) shows data of the eight-layer wiring board and line (L3) shows data of the 10-layer wiring board.

In each of the six-layer, eight-layer and 10-layer wiring boards, the stress on the core (through-hole conductor) is the greatest, and stress decreases as tiers go farther from the core as shown in FIGS. 10A and 10B. In addition, when stresses are compared in six-layer, eight-layer and 10-layer wiring boards, stress in the 10-layer wiring board is the greatest, stress in the eight-layer wiring board is the second greatest and stress in the six-layer wiring board is the smallest. From those results, stress in a wiring board is thought to increase as the number of layers in a wiring board increases.

In a wiring board with a stacked structure, thermal stress tends to concentrate on the core (through-hole conductor) of the stacked structure as described above. That is thought to be caused by a difference between the thermal expansion coefficient of interlayer insulation layers (such as resin) and the thermal expansion coefficient of through-hole conductors (such as metal). For that matter, the strength of through-hole conductor 121 is enhanced in wiring board 100 of the present embodiment so as to be tolerant to such stresses.

In particular, to enhance the strength of through-hole conductor 121, for example, it is an option to set through-hole conductor 121 wider than via conductor 221 or 321 to be stacked on its top. That is thought to be because the mechanical strength of through-hole conductor 121 increases as through-hole conductor 121 becomes wider.

However, to the contrary, the strength of through-hole conductor 121 (subsequently, of the core section) increases when through-hole conductor 121 is set narrower. That is thought to be because voids are suppressed in through hole (121a). In wiring board 100 of the present embodiment, width (D11) of end surface (121c) of through-hole conductor 121 is set smaller than width (D32) of upper-end surface (321c) of via conductor 321 (see FIG. 7). Accordingly, it is thought that voids are suppressed from occurring in through-hole conductor 121 (in particular, the portion between land (121d) and narrowed portion (121b)), making it easier to obtain greater strength in through-hole conductor 121. In addition, since width (D11) of end surface (121c) of through-hole conductor 121 is set greater than width (D31) of bottom (321b) of via conductor 321, it is thought to be easier to align via conductor 321, leading to securer electrical connections, and subsequently to excellent electrical characteristics. Moreover, recess (121e) is formed in land (121d) of through-hole conductor 121, allowing via conductor 321 to enter recess (121e). Accordingly, land (121d) and via conductor 321 are firmly connected, and it is thought to be easier to achieve even higher electrical connection reliability in stacked structure (S11).

Also, on the land (121g) side of through-hole conductor 121 as well, since width (D12) of end surface (121f) of through-hole conductor 121 is set greater than width (D21) of bottom (221b) of via conductor 221 while being set smaller than width (D22) of upper-end surface (221c) of via conductor 221, the greater strength or the like described above is thought to be easier to achieve. In addition, recess (121h) is formed in land (121g) of through-hole conductor 121, allowing via conductor 221 to enter recess (121h). Thus, it is thought to be easier to achieve even higher connection reliability between land (121g) and via conductor 221.

In addition, when considering the cost, forming a narrower through-hole conductor 121 is advantageous, since the amount of material consumed and time for forming it are reduced compared with forming a wider through-hole conductor 121. Also, if through-hole conductor 121 is set narrower, it is easier to form fine wiring around the core (conductive layers 111, 112 or the like). As a result, it is easier to form high-density wiring in the inner layers of wiring board 100.

To obtain the above effects, through-hole conductor 121 is preferred to have such a shape that becomes narrower as its width goes farther from end surface (121c) or (121f) (hour-glass shape). Voids tend to be suppressed in through-hole conductor 121 in such a shape.

In wiring board 100 of the present embodiment, through-hole conductor 121 instead of a via conductor is formed in core insulation layer (10a). When a via conductor is formed, resin residue usually tends to remain on the bottom of the via hole. In addition, it is thought that a seam tends to be formed on the bottom of the via conductor. For that matter, since part of through-hole conductor 121 is made contiguous to conductive layers (111, 112) on both sides of core insulation layer (10a) (in particular, lands (121d, 121g)), it is made seamless in wiring board 100. If a via conductor is used in a core where stress tends to concentrate, an interface is formed on the bottom between copper foil and plating, and cracks tend to occur originating in such an interface. However, if a through-hole conductor is used, it penetrates through copper foil, eliminating such an interface. Therefore, cracks seldom occur. As a result, it is thought to be easier to achieve higher connection reliability in stacked structure (S11). In addition, voids are less likely to occur in a through-hole conductor than in a via conductor.

In wiring board 100 of the present embodiment, among via conductors of stacked structure (S11), widths of via conductors increase as they come closer to outermost layers (via conductors (821, 921)). Since stacked structure (S11) is substantially shaped to be narrower as its width comes closer to the core (in particular, narrowed portion (121b) of through-hole conductor 121), it is easier to absorb external stress. Accordingly, even with a rigid metallic column that forms stacked structure (S11), it is thought to be easier to achieve higher connection reliability in stacked structure (S11) (especially its outer-layer sides).

It is thought that via conductors of stacked structure (S11) obtain greater strength as their widths become greater (wider). Also, connection areas of via conductors (or via holes and via conductors) to be stacked increase as their widths become greater. Thus, the connection strength is thought to be enhanced. On the other hand, it is thought to be easier to set fine wiring pitches as widths of via conductors become smaller. Accordingly, using the above structure, it is thought to be easier to form high-density wiring in the inner layers of wiring where greater force is less likely exerted while enhancing the strength of outer layers of the wiring board where greater force tends to be exerted.

Figure 7:
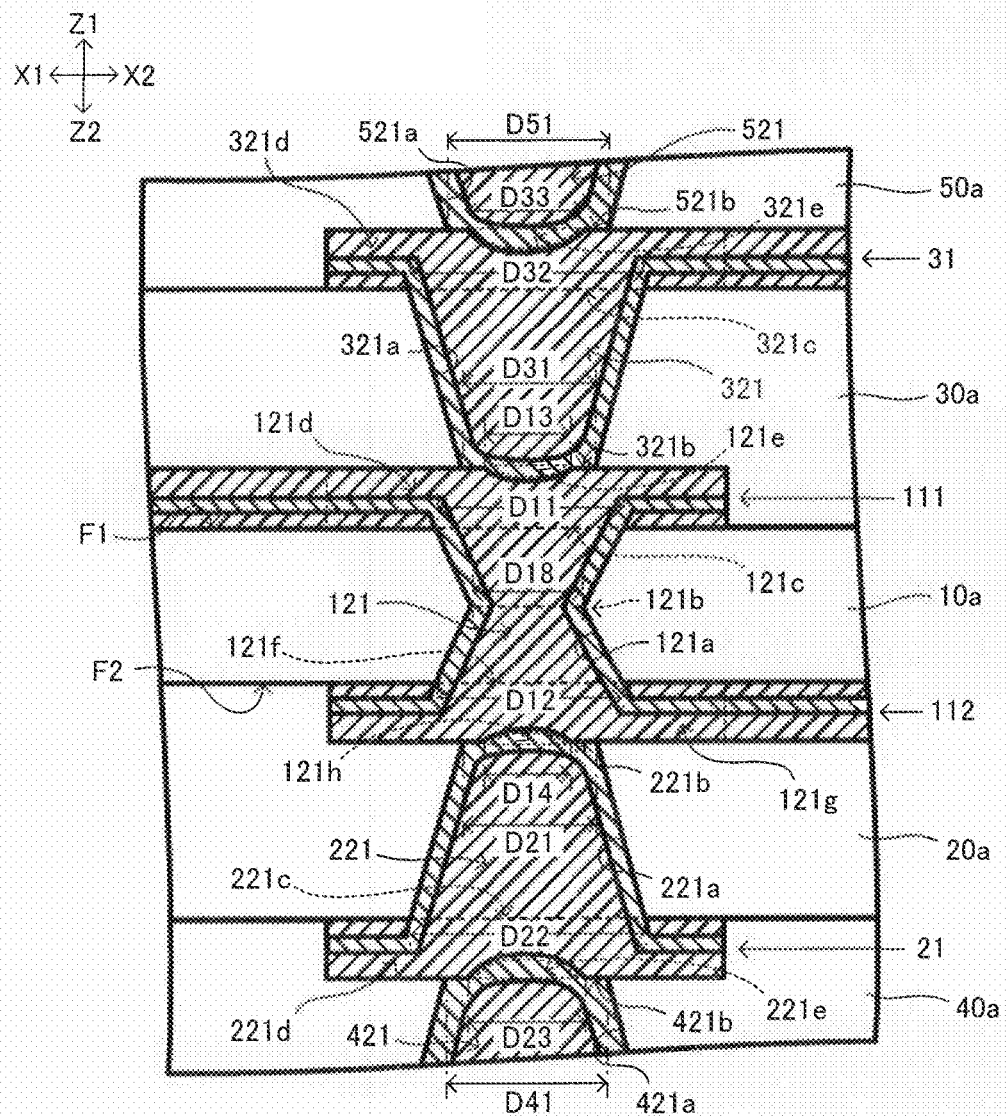
FIG. 7 is a cross-sectional view illustrating the structure of a through-hole conductor and the via conductors stacked on both of its surfaces in the stacked structure shown in FIG. 2.

In wiring board 100 of the present embodiment, width (D18) of narrowed portion (121b) of through-hole conductor 121 is set smaller than width (D21) of bottom (221b) of via conductor 221 (see FIG. 7). Accordingly, it is thought to be easier to absorb stress that travels from via conductor 221 to narrowed portion (121b) of through-hole conductor 121. In addition, width (D18) of narrowed portion (121b) of through-hole conductor 121 is set smaller than width (D31) of bottom (321b) of via conductor 321. Accordingly, it is thought to be easier to absorb stress that travels from via conductor 321 to narrowed portion (121b) of through-hole conductor 121. In wiring board 100 of the present embodiment, stresses from both sides of through-hole conductor 121 (the via conductor 221 side and the via conductor 321 side) are each suppressed, and it is thought that stress is less likely to be concentrated on narrowed portion (121b) of through-hole conductor 121. As a result, it is thought to be easier to suppress cracking from occurring in the core (through-hole conductor 121) of stacked structure (S11) where thermal stress tends to be concentrated.

In the present embodiment, via conductors positioned in the same tiers in stacked structure (S11) have substantially the same width as each other, for example. Also, regarding the via conductors facing the same direction, the greater the width of a via hole, the deeper the recess formed in its land. Namely, as the width of a via hole becomes greater, the recess formed in its land becomes deeper. In stacked structure (S11) of the present embodiment, a via conductor stacked on a land enters the recess of the land. Thus, it is thought to be easier to enhance electrical connection reliability between the land and the via conductor. In such a case, as the width or depth of a recess formed in a land becomes greater, it is thought that electrical connection reliability is also enhanced between the land and the via conductor.

In wiring board 100 of the present embodiment, recesses (121e, 121h) are formed in surfaces of lands (121d, 121g) of through-hole conductor 121 respectively. Accordingly, it is easier to manufacture a wiring board having a stacked structure with high connection reliability. For example, when a via conductor (hereinafter referred to as an upper-layer via conductor) is stacked on a land (hereinafter referred to as a lower-layer land), a laser is irradiated to remove the insulation layer on a lower-layer land and a via hole is formed for an upper-layer via conductor. When a recess is formed on the surface of a lower-layer land during such laser irradiation, it is thought that laser light produces an irregular reflection at the recess formed on the surface of a lower-layer land, making it easier to increase the width (opening width) of the via hole for an upper-layer via conductor (see FIG. 14 or the like described later). As described above, by using an irregular reflection of laser light, it is thought to be easier to form via conductors of stacked structure (S11) in a way that the widths of via conductors increase as they come closer to outermost layers (via conductors (821, 921)).

Also, when the width of a via hole becomes wider, it is hard to completely fill conductor in the via hole. Thus, when an upper-layer via conductor is stacked on a lower-layer via conductor, it is thought that a recess deeper than the recess of the lower-layer via conductor tends to be formed on the land surface of the upper-layer via conductor.

In wiring board 100 of the present embodiment, the first stacked portion and the second stacked portion of stacked structure (S11) are each made by stacking four via conductors. Namely, the first stacked portion and the second stacked portion of stacked structure (S11) are formed by stacking four or more via conductors. The effects of a method for manufacturing a wiring board achieved by using irregular reflection of laser light to set wider widths in upper-layer via conductors are especially notable when the number of stacked vias is four or more. However, that is not the only option, and the number of via conductors in stacked structure (S11) may be determined freely. First and second stacked portions may each have five or more via conductors, or four or fewer via conductors. In addition, laminated sections (B1, B2) may be formed with five or more sets of interlayer insulation layers and conductive layers, or they may have four or fewer sets of interlayer insulation layers and conductive layers.

In wiring board 100 of the present embodiment, via conductors that do not form stacked structure (S11) are also formed in interlayer insulation layers where via conductors of stacked structure (S11) are formed (any of insulation layers (30a, 40a, 50a, 60a, 70a, 80a, 90a)) as shown in FIG. 1. The bottom of a via conductor not to be stacked is substantially flat, and the previously described irregular reflection of laser light does not occur (see later-described FIG. 14 or the like). Thus, a via conductor not to be stacked is easier to form with a smaller width than is a via conductor to be stacked. Also, a shallower recess tends to be formed on the land surface of a via conductor not to be stacked, compared with a recess formed on the land surface of a via conductor to be stacked.

Following are preferred examples of materials for wiring board 100 of the present embodiment.

In the present embodiment, core insulation layer (10a) is made of resin containing core material. Specifically, for example, core insulation layer (10a) is made by impregnating glass cloth (core material) with epoxy resin (hereinafter referred to as glass epoxy). The core material has a smaller thermal expansion coefficient than the main material (epoxy resin in the present embodiment). As for core materials, inorganic materials such as glass fiber (glass cloth or glass nonwoven fabric, for example), aramid fiber (aramid nonwoven fabric, for example) or silica filler are considered preferable. However, the material of core insulation layer (10a) may be determined freely. For example, core insulation layer (10a) may contain inorganic filler (such as silica filler) separate from that in core material. In addition, core insulation layer (10a) may be formed with resin that does not contain core material. Also, polyester resin, bismaleimide triazine resin (BT resin), imide resin (polyimide), phenol resin, allyl polyphenylene ether resin (A-PPE resin) or the like may be used instead of epoxy resin. Core insulation layer (10a) may be formed with multiple layers of different materials.

In the present embodiment, insulation layers (20a, 30a, 40a, 50a, 60a, 70a, 80a, 90a) are each made by impregnating core material with resin. Specifically, insulation layers (20a, 30a, 40a, 50a, 60a, 70a, 80a, 90a) are each made of glass epoxy, for example. However, that is not the only option; for example, each insulation layer may contain inorganic filler (such as silica filler) separate from that in core material. Also, each insulation layer may be made of resin that does not contain core material. Alternatively, polyester resin, bismaleimide triazine resin (BT resin), imide resin (polyimide), phenol resin, allyl polyphenylene ether resin (A-PPE resin) or the like may also be used instead of epoxy resin. Each insulation layer may be made of multiple layers of different materials.

In the present embodiment, all the insulation layers (core insulation layer (10a) and insulation layers (20a, 30a, 40a, 50a, 60a, 70a, 80a, 90a)), in which the through-hole conductor and via conductors of stacked structure (S11) are formed, are made of the same material (such as glass epoxy) and are formed by impregnating core material with resin. Accordingly, it is easier to achieve uniform results by laser processing. Also, to enhance tolerance (strength) to stress, at least all the insulation layers having the via conductors of stacked structure (S11) are preferred to be made by impregnating core material with resin. However, that is not the only option, and those insulation layers may be made of different materials from each other.

In the present embodiment, through-hole conductors 12 and via conductors (22, 32, 42, 52, 62, 72, 82, 92) are each made of copper plating, for example.

Conductive layers (111, 112, 21, 31, 41, 51, 61, 71, 81, 91) are each made of copper foil and copper plating, for example.

However, the material of each conductive layer and each via conductor is not limited specifically. As long as it is conductive, metallic or nonmetallic material may be used. Each conductive layer and each via conductor may also be formed with multiple layers of different materials.

In the following, preferred examples of measurements are shown for wiring board 100 of the present embodiment.

In FIG. 1, thickness (D101) of core insulation layer (10a) is approximately 60 μm, for example. In FIG. 2, thickness (D111) of conductive layer 111 and thickness (D112) of conductive layer 112 are each approximately 18 μm, for example. In the present embodiment, thickness (D111) of conductive layer 111 and thickness (D112) of conductive layer 112 are the same as each other. However, that is not the only option, and their thicknesses may be different from each other.

In FIG. 1, thickness (D102) of insulation layer (20a), thickness (D103) of insulation layer (30a), thickness (D104) of insulation layer (40a) and thickness (D105) of insulation layer (50a) are each approximately 60 μm, for example. In the present embodiment, thickness (D102) of insulation layer (20a), thickness (D103) of insulation layer (30a), thickness (D104) of insulation layer (40a) and thickness (D105) of insulation layer (50a) are the same as each other. However, that is not the only option, and they may be different from each other.

In FIG. 1, thickness (D106) of insulation layer (60a), thickness (D107) of insulation layer (70a), thickness (D108) of insulation layer (80a) and thickness (D109) of insulation layer (90a) are each approximately 50 μm, for example. In the present embodiment, thickness (D106) of insulation layer (60a), thickness (D107) of insulation layer (70a), thickness (D108) of insulation layer (80a) and thickness (D109) of insulation layer (90a) are the same as each other. However, that is not the only option, and they may be different from each other.

In FIG. 2, thickness (D2) of conductive layer 21, thickness (D3) of conductive layer 31, thickness (D4) of conductive layer 41, thickness (D5) of conductive layer 51, thickness (D6) of conductive layer 61 and thickness (D7) of conductive layer 71 are each approximately 18 μm, for example. Thickness (D2) of conductive layer 21, thickness (D3) of conductive layer 31, thickness (D4) of conductive layer 41, thickness (D5) of conductive layer 51, thickness (D6) of conductive layer 61 and thickness (D7) of conductive layer 71 are the same as each other. However, that is not the only option, and they may be different from each other.

In FIG. 2, thickness (D8) of conductive layer 81 and thickness (D9) of conductive layer 91 are each approximately 25 for example. Thickness (D8) of conductive layer 81 and thickness (D9) of conductive layer 91 are the same as each other. However, that is not the only option, and they may be different from each other.

Here, the thickness of each conductive layer above is measured using the upper surface of its lower-layer insulation layer (or the core substrate) as the base (zero), and the thickness of each insulation layer is measured using the upper surface of its lower-layer conductive layer as the base (zero) (see FIGS. 1 and 2).

In the present embodiment, the thickness of an insulation layer is set smaller in the outer third and fourth tiers than in the inner first and second tiers of laminated sections (B1, B2). Thus, it is easier to reduce the time required for laser processing when via holes are formed in the insulation layers of the outer third and fourth tiers. As a result, it is easier to suppress the widths of via holes from increasing, which results from irregular reflection. In addition, if the widths of via holes are smaller, it is easier to fill conductor (such as electrolytic plating) in via holes. As a result, recesses formed in via-conductor lands are suppressed from deepening in the outer layers of wiring board 100.

In the present embodiment, the thickness of two outer insulation layers is set smaller than the thickness of the other insulation layers (two inner layers). However, that is not the only option. For example, the thickness of an outer insulation layer may be set smaller than the other insulation layers (three inner layers). Alternatively, thicknesses of insulation layers in laminated sections (B1, B2) may be reduced gradually so that their thicknesses become smaller toward the outer layers from the first tier, second tier, third tier and fourth tier in that order starting with the thickest.

In addition, when flatness is required to be secured or the like, the thickness of two inner insulation layers is set smaller than the thickness of the other insulation layers (two outer layers). Alternatively, the thickness of an inner insulation layer may be set smaller than the other insulation layers (three outer layers). Yet alternatively, thicknesses of insulation layers in laminated sections (B1, B2) may be increased gradually so that their thicknesses become greater toward the outer layers from the first tier, second tier, third tier and fourth tier in that order starting with the thinnest.

Also, all the insulation layers (core insulation layer (10a), insulation layers (20a, 30a, 40a, 50a, 60a, 70a, 80a, 90a)), in which through-hole conductor 121 and each via conductor of stacked structure (S11) are formed, may be set to have substantially the same thickness as each other. According to such a structure, there is no need to change thicknesses for each insulation layer, thus leading to simplified manufacturing. At least all the insulation layers having via conductors of stacked structure (S11) are preferred to have substantially the same thickness as each other.

Regarding the measurements of through-hole conductor 121 shown in FIG. 4, width (D11) of end surface (121c) and width (D12) of end surface (121f) are each approximately 75 µm, for example, and width (D18) of narrowed portion (121b) is approximately 50 µm, for example. Also, width (D15) of land (121d) and width (D16) of land (121g) are each approximately 250 µm, for example. Width (D13) of recess (121e) formed in land (121d) and width (D14) of recess (121h) formed in land (121g) are each approximately 30 µm, for example. However, those are not the only options, and widths (D11) and (D12), widths (D13) and (D14), widths (D15) and (D16) may each be different from each other.

Regarding via conductors of the first stacked portion of stacked structure (S11) in FIG. 2, width (D32) of upper-end surface (321c) (FIG. 7) is approximately 80 µm, for example, the width of upper-end surface (521c) is approximately 85 µm, for example, the width of upper-end surface (721c) is approximately 90 µm, for example, and the width of upper-end surface (921c) is approximately 95 µm, for example. Regarding via conductors of the second stacked portion of stacked structure (S11), width (D22) of upper-end surface (221c) (FIG. 7) is approximately 80 µm, for example, the width of upper-end surface (421c) is approximately 85 µm, for example, the width of upper-end surface (621c) is approximately 90 µm, for example, and the width of upper-end surface (821c) is approximately 95 µm, for example. The width of the upper-end surface of each via conductor corresponds to width (D203) of upper-end surface (P3) shown in FIG. 5.

Regarding via conductors (321, 521, 721, 921) of the first stacked portion of stacked structure (S11) in FIG. 2, the widths of bottoms (321b, 521b, 721b, 921b) are, for example, approximately 60 µm, approximately 65 µm, approximately 70 µm and approximately 75 µm respectively. Regarding via conductors (221, 421, 621, 821) of the second stacked portion of stacked structure (S11), the widths of bottoms (221b, 421b, 621b, 821b) are, for example, approximately 60 µm, approximately 65 µm, approximately 70 µm and approximately 75 µm respectively. The width of the bottom of each via conductor corresponds to width (D202) of bottom (P2) shown in FIG. 5.

In FIG. 2, the land width of each via conductor of stacked structure (S11) is 250 µm, for example. In the present embodiment, the land widths of through-hole conductor 121 and all the via conductors of stacked structure (S11) are substantially the same as each other. However, that is not the only option, and they may be different from each other. The land width of each via conductor corresponds to width (D204) of land (P4) shown in FIG. 5.

Figure 11:
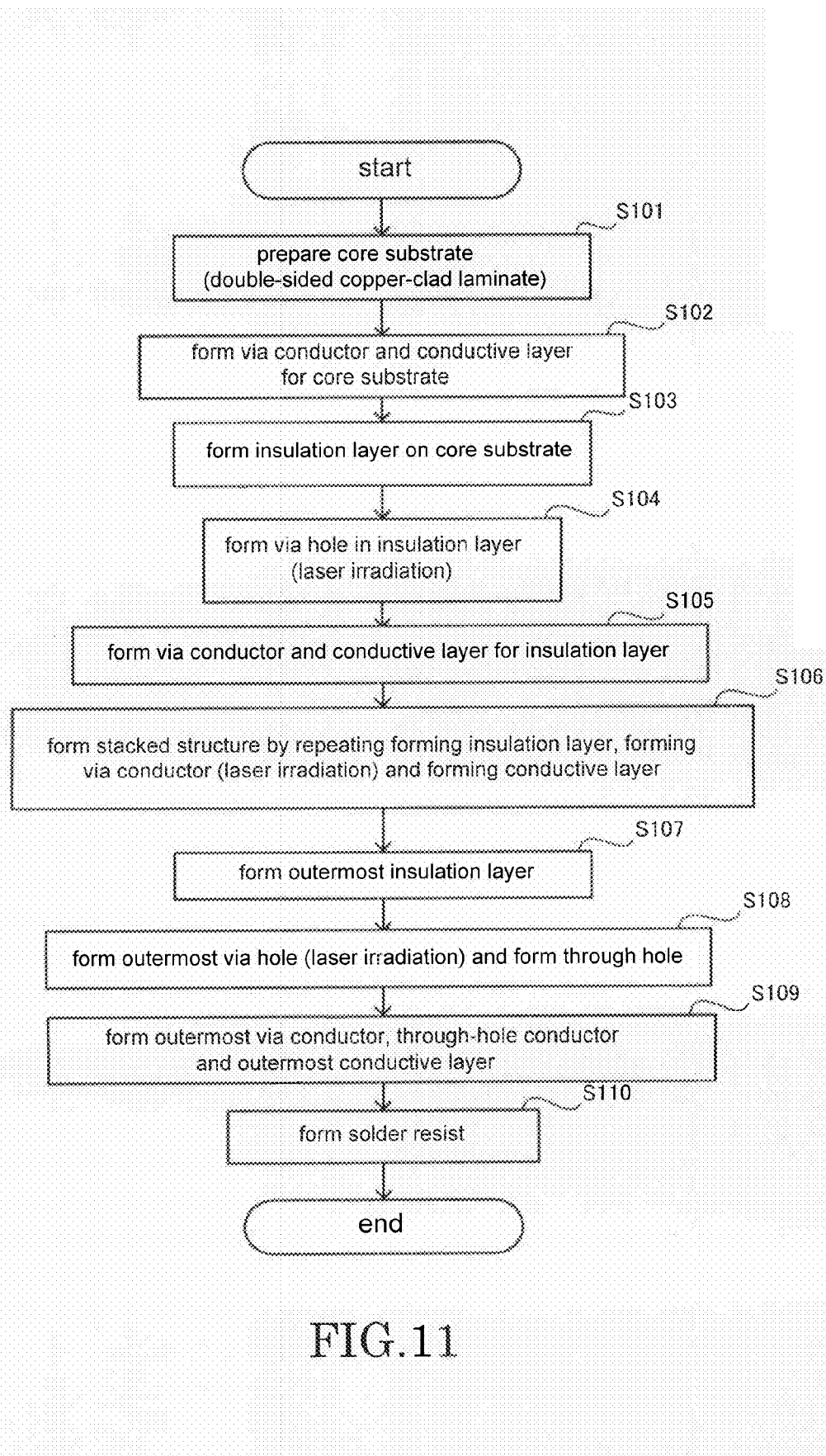
FIG. 11 is a flowchart showing a method for manufacturing a wiring board according to an embodiment of the present invention.

In the following a method for manufacturing wiring board 100 of the present embodiment is described. FIG. 11 is a flowchart schematically showing the contents and processes of the method for manufacturing wiring board 100 according to the present embodiment.

Figure 12A:
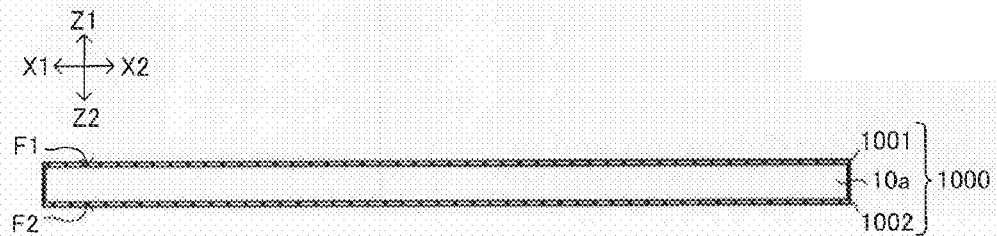
FIG. 12A, in the manufacturing method of a wiring board shown in FIG. 11, is a view illustrating a step for preparing a core substrate (core insulation layer)

In step (S101) of FIG. 11, the core substrate of wiring board 100 is prepared. Specifically, double-sided copper-clad laminate 1000 (starting material) is prepared as shown in FIG. 12A. Double-sided copper-clad laminate 1000 has core insulation layer (10a) (core substrate) and metal foils (1001, 1002) (each a copper foil, for example). Metal foil 1001 is formed on surface (F1) of core insulation layer (10a), and metal foil 1002 is formed on surface (F2) of core insulation layer (10a). In the present embodiment, core insulation layer (10a) is made of completely cured (C-stage) glass epoxy at this stage.

In the present embodiment, metal foils (1001, 1002) with a predetermined thickness are laminated on core insulation layer (10a) without adjusting thicknesses by etching, for example. However, that is not the only option, and the method for forming metal foils (1001, 1002) may be selected freely. For example, relatively thick metal foils are laminated on core insulation layer (10a) and those metal foils are half etched to obtain metal foils (1001, 1002) with a predetermined thickness.

In step (S102) of FIG. 11, through-hole conductors are formed in core insulation layer (10a) (core substrate), while conductive layers are formed on both surfaces of core insulation layer (10a) (core substrate).

Figure 12B:
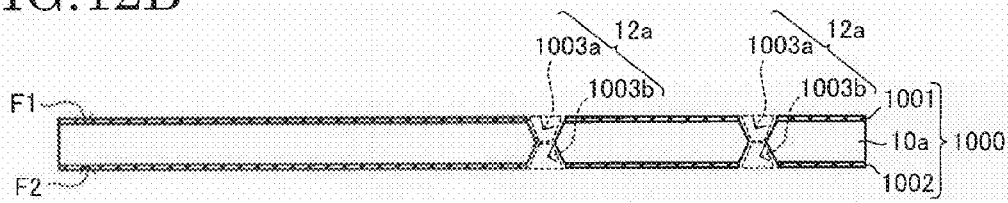
FIG. 12B is a view illustrating a first step for forming via conductors in the core substrate prepared in the step in FIG. 12A and forming conductive layers on the core substrate.

Specifically, as shown in FIG. 12B, a $CO_2$ laser, for example, is used to irradiate laser on double-sided copper-clad laminate 1000 from the surface (F1) side to form holes (1003a), and to irradiate laser on double-sided copper-clad laminate 1000 from the surface (F2) side to form holes (1003*b*). Hole (1003*a*) and hole (1003*b*) are formed at substantially the same position on the X-Y plane, and are subsequently joined to become through hole (12*a*) which penetrates through double-sided copper-clad laminate 1000. Through hole (12*a*) is shaped like an hourglass, for example. The boundary of hole (1003*a*) and hole (1003*b*) corresponds to narrowed portion (12*b*) (FIG. 1). The laser may be irradiated on surface (F1) and surface (F2) simultaneously, or one surface at a time. After through holes (12*a*) are formed, desmearing is preferred to be conducted on through holes (12*a*). Unwanted conduction (short circuiting) is suppressed by desmearing. Also, to enhance the efficiency of laser absorption, black-oxide treatments may be conducted on surfaces of metal foils (1001, 1002) prior to laser irradiation. Through holes (12*a*) may be formed by a drill or through etching instead of using a laser. However, fine processing is more easily done by laser. Also, laser processing makes it easier to form through holes (12*a*) in an hourglass shape.

Figure 12C:
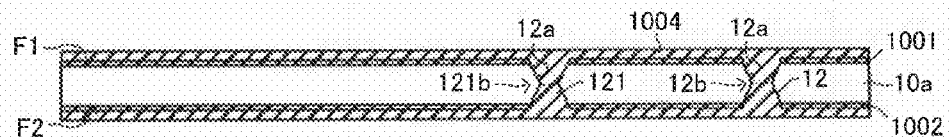
FIG. 12C is a view illustrating a second step subsequent to the step in FIG. 12B.

As shown in FIG. 12C, by copper panel plating, for example, plating 1004 is formed on metal foil 1001, in through holes (12*a*) and on metal foil 1002. Accordingly, plating 1004 is filled in through holes (12*a*). As a result, through-hole conductors 12 are formed (including through-hole conductor 121 of stacked structure (S11) shown in FIG. 2).

Plating 1004 is formed by performing electroless plating to form electroless plated film, for example, and by performing electrolytic plating using the electroless plated film as a seed layer. In the manufacturing method of the present embodiment, metal foils (1001, 1002) respectively form metal foils (111*a*, 112*a*) shown in FIG. 4, and plating 1004 forms electroless plated films (111*b*, 112*b*, 113*a*) and electrolytic plating (111*c*, 112*c*, 113*b*) shown in FIG. 4.

As plating solutions for electroless plating, copper sulfate solutions with added reduction agents or the like may be used, for example. Also, as plating solutions for electrolytic plating, solutions of copper sulfate, copper pyrophosphate, copper cyanide, cupric fluoroborate or the like may be used, for example.

Figure 12D:
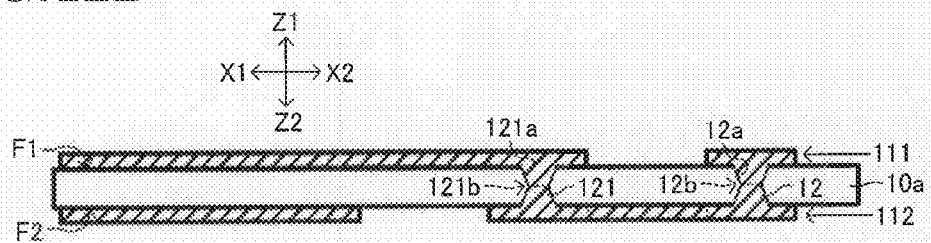
FIG. 12D is a view illustrating a third step subsequent to the step in FIG. 12C.

Using etching resists patterned by a lithographic technique, for example, and an etching solution, conductive layers formed on surfaces (F1, F2) of core insulation layer (10*a*) are patterned. Specifically, conductive layers are covered by etching resists patterned corresponding to conductive layers (111, 112) (see FIG. 12D), and portions of conductive layers not covered by etching resists (portions exposed through opening portions of the etching resists) are etched away. Etching is not limited to wet etching, and dry etching may also be conducted. Accordingly, conductive layer 111 is formed on surface (F 1) of core insulation layer (10*a*) and conductive layer 112 is formed on surface (F2) of core insulation layer (10*a*), as shown in FIG. 12D.

Land (121*d*) (see FIG. 4) is included in conductive layer 111, and land (121*g*) (see FIG. 4) is included in conductive layer 112. Recess (121*e*) (see FIG. 4) is formed on a surface of land (121*d*) of through-hole conductor 121, and recess (121*h*) (see FIG. 4) is formed on a surface of land (121*g*) of through-hole conductor 121. Land (121*d*) and land (121*g*) are electrically connected seamlessly by through-hole conductor 121.

Conductive layers (111, 112) may be patterned not by etching, but by pattern plating using plating resist.

In addition, after conductive layers (111, 112) are formed, upper surfaces of conductive layers (111, 112) may be roughened by chemical etching, for example, if required. Methods for roughening are not limited to chemical etching, and any other method may be employed.

In steps (S103)~(S105) of FIG. 11, a set of an interlayer insulation layer and a conductive layer is formed on each of surfaces (F1) and (F2) of core insulation layer (10*a*) (core substrate) (first tiers of laminated sections (B1, B2)). Via conductors are formed in such an interlayer insulation layer, and the conductive layer on the interlayer insulation layer is electrically connected to the conductive layer on the core substrate by those via conductors.

Figure 13A:
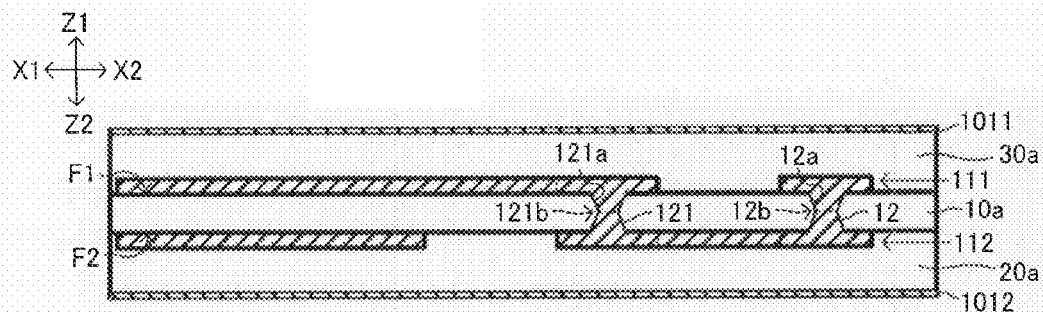
FIG. 13A, in the manufacturing method of a wiring board shown in FIG. 11, is a view illustrating a first step for forming a first tier of a laminated section.

Specifically, in step (S103) of FIG. 11, as shown in FIG. 13A, for example, insulation layer (30*a*) (interlayer insulation layer) and metal foil 1011 (such as copper foil) are positioned in that order on surface (F1) of core insulation layer (10*a*) and conductive layer 111, while insulation layer (20*a*) (interlayer insulation layer) and metal foil 1012 (such as copper foil) are positioned in that order on surface (F2) of core insulation layer (10*a*) and conductive layer 112. In the following, a substrate where insulation layers (20*a*, 30*a*) and metal foils (1011, 1012) are laminated on core insulation layer (10*a*) is referred to as a first laminate (see FIG. 13A).

Insulation layers (20*a*, 30*a*) and metal foils (1011, 1012) may be prepared as copper foils with resin, for example. At this stage, insulation layers (20*a*, 30*a*) are each made of prepreg of thermosetting glass epoxy (B-stage adhesive sheet), for example. However, instead of using prepreg, ABF (Ajinomoto build-up film, made by Ajinomoto Fine-Techno Co., Inc.) or the like may also be used. ABF is a film made by sandwiching insulative material between two protective sheets.

Thermal pressing in direction Z is conducted on the first laminate. Pressing and thermal treatments are conducted simultaneously, for example. Prepreg (insulation layers (20*a*, 30*a*)) is cured by thermal pressing and members are adhered to each other. As a result, the first laminate becomes integrated. Here, pressing and thermal treatments may be divided into multiple procedures. Thermal treatments and pressing may be conducted separately, but it is more efficient if they are conducted simultaneously. After thermal pressing, another thermal treatment may be conducted for integration.

Figure 13B:
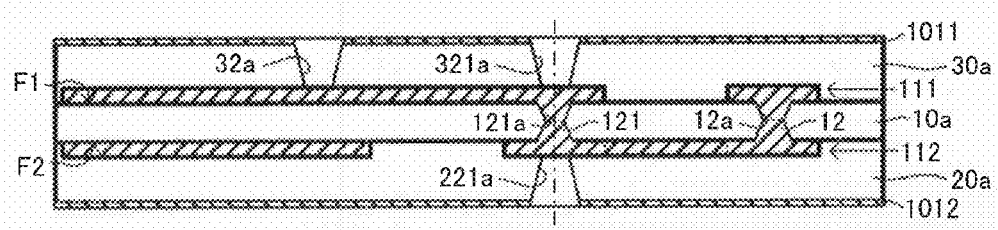
FIG. 13B is a view illustrating a second step (laser irradiation step) subsequent to the step in FIG. 13A.
Figure 14:
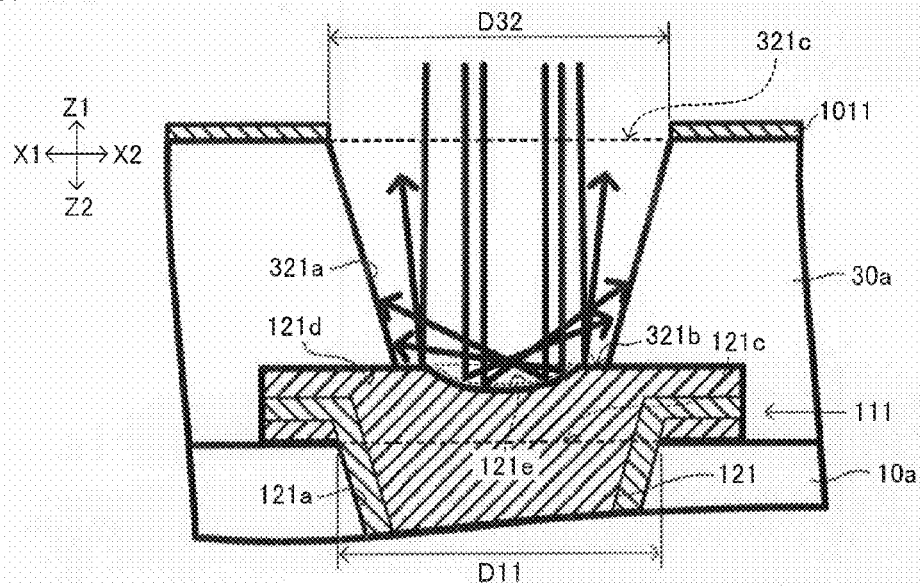
FIG. 14 is a view showing how laser light is reflected in the second step in FIG. 13B.

In step (S104) of FIG. 11, using a laser ($CO_2$ laser or the like), for example, via holes (22*a*) (including via hole (221*a*)) of stacked structure (S11) shown in FIG. 2) are formed in insulation layer (20*a*), and via holes (32*a*) (including via hole (321*a*) of stacked structure (S11) shown in FIG. 2) are formed in insulation layer (30*a*), as shown in FIG. 13B. When forming via hole (321*a*), insulation layer (30*a*) on land (121*d*) of through-hole conductor 121 is removed by laser irradiation as shown in FIG. 14, for example. During that time, since recess (121*e*) is formed on a surface of land (121*d*) of through-hole conductor 121, laser light reflects irregularly in recess (121*e*), causing more light to be irradiated on side surfaces of via hole (321*a*). Therefore, the opening width of via hole (321*a*) (=width (D32) of upper-end surface (321*c*) of via conductor 321) tends to be greater than width (D11) of end surface (121*c*) of through-hole conductor 121. In the present embodiment, via hole (321*a*) is formed, having an opening width greater than width (D11) of end surface (121*c*) of through-hole conductor 121. Also, via hole (221*a*) is formed on land (121*g*) of through-hole conductor 121 (see FIG. 4), the same as via hole (321*a*), for example. In the present embodiment, axes in direction Z substantially correspond to each other in via holes (221*a*, 321*a*). Via holes (221*a*, 321*a*) may be formed at the same time or separately.

Black-oxide treatments are preferred to be conducted prior to making holes (laser irradiation) depending on requirements. Also, if required, desmearing and soft etching are conducted after holes are formed.

In the present embodiment, a shading mask is not used, for example, and laser light is irradiated only on the required portions by halting laser irradiation on portions that do not require irradiation. However, that is not the only option, and laser light may be irradiated on the entire surface of a target using a shading mask, for example. Laser intensity (the amount of laser light) is preferred to be adjusted by pulse control. Specifically, when change in laser intensity is required, the number of shots (irradiation number) is changed without adjusting laser intensity per shot (per irradiation), for example. Namely, if required laser intensity is not obtained by one shot, a laser is irradiated again at the same spot. Throughput is thought to be improved by such a control method since time to adjust irradiation conditions is omitted. However, methods for adjusting laser intensity are not limited specifically, and any other method may be employed. For example, it is an option to determine irradiation conditions for each irradiation spot and to set the irradiation number constant (one shot per irradiation spot, for example).

Figure 15:
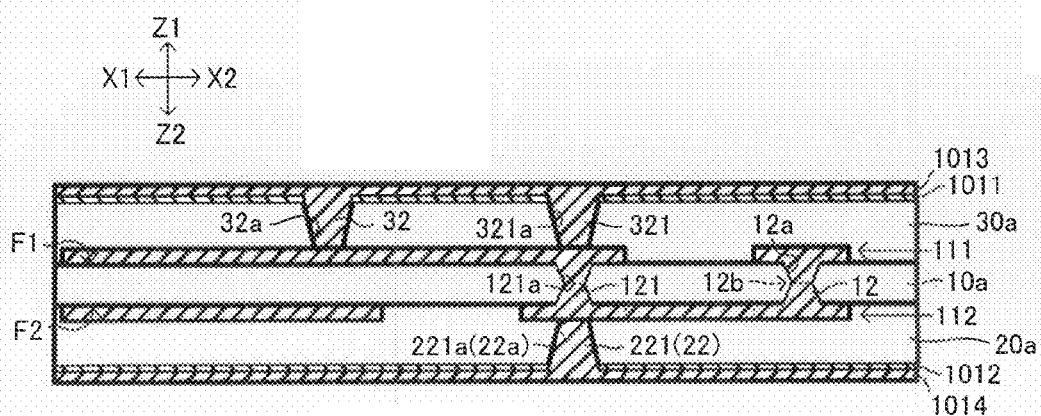
FIG. 15 is a view illustrating a third step subsequent to the step in FIG. 13B.

In step (S105) of FIG. 11, using copper panel plating, for example, plating 1013 is formed on metal foil 1011 and in via holes (32a), and plating 1014 is formed on metal foil 1012 and in via holes (22a), as shown in FIG. 15. Platings (1013, 1014) are each formed by performing electroless plating to form electroless plated film and by performing electrolytic plating using the electroless plated film as a seed layer, the same as in the process in FIG. 12C, for example. Accordingly, via holes (32a, 22a) are filled with platings (1013, 1014) respectively. As a result, via conductors 22 (including via conductor 221 of stacked structure (S11) shown in FIG. 2) and via conductors 32 (including via conductor 321 of stacked structure (S11) shown in FIG. 2) are formed.

Recess (221e) deeper than recess (121h) of through-hole conductor 121 is formed on a surface of land (221d) of via conductor 221, and recess (321e) deeper than recess (121e) of through-hole conductor 121 is formed on a surface of land (321d) of via conductor 321 (see FIG. 2).

Figure 16:
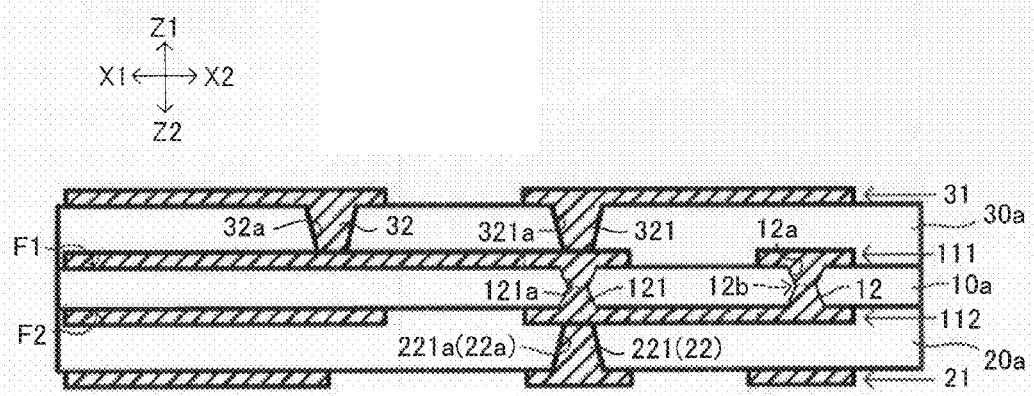
FIG. 16 is a view illustrating a fourth step subsequent to the step in FIG. 15.

As shown in FIG. 16, using a lithographic technique (etching resist, or the like), for example, conductive layers on insulation layers (20a, 30a) are patterned respectively. Accordingly, conductive layer 21 is formed on insulation layer (20a), and conductive layer 31 is formed on insulation layer (30a). Then, surfaces of conductive layers (21, 31) are roughened, depending on requirements.

Conductive layers (21, 31) may be patterned not by etching, but by pattern plating using plating resist.

In step (S106) of FIG. 11, second and third tiers are formed for laminated sections (B1, B2).

Figure 17:
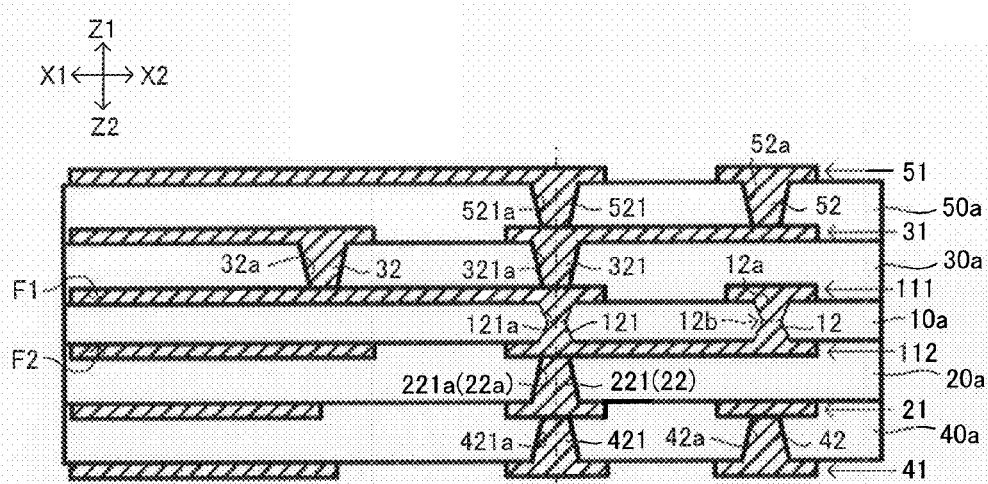
FIG. 17, in the manufacturing method of a wiring board shown in FIG. 11, is a view illustrating a step for forming a second tier of a laminated section.

Specifically, as shown in FIG. 17, for example, a set of an interlayer insulation layer and a conductive layer is formed as a second tier for each of laminated sections (B1, B2). Second tiers of laminated sections (B1, B2) are formed the same as the first tiers of laminated sections (B1, B2), for example, namely, by laminating insulation layers and metal foils (such as copper foil with resin), pressing, curing resin, forming via holes (laser irradiation), forming via conductors and forming conductive layers (including roughening treatments).

Accordingly, a set of insulation layer (40a) and conductive layer 41 is formed on insulation layer (20a) and conductive layer 21, and a set of insulation layer (50a) and conductive layer 51 is formed on insulation layer (30a) and conductive layer 31. Via conductors 42 (including via conductor 421 of stacked structure (S11) shown in FIG. 2) are formed in insulation layer (40a), and via conductors 52 (including via conductor 521 of stacked structure (S11) shown in FIG. 2) are formed in insulation layer (50a).

When forming via holes (421a, 521a), due to irregular reflection of laser light at recess (321e) or (221e) (see FIG. 14), for example, via hole (521a) with a greater width than the width of via hole (321a) is formed, as well as via hole (421a) with a greater width than the width of via hole (221a) (see FIG. 2). In the present embodiment, axes in direction Z substantially correspond to each other in via holes (221a, 321a, 421a, 521a).

When forming via conductors (421, 521), recess (521e) deeper than recess (321e) is formed on a surface of land (521d) of via conductor 521, and recess (421e) deeper than recess (221e) is formed on a surface of land (421d) of via conductor 421 (see FIG. 2).

Conductive layers (41, 51) may be patterned not by etching, but by pattern plating using plating resist.

Figure 18:
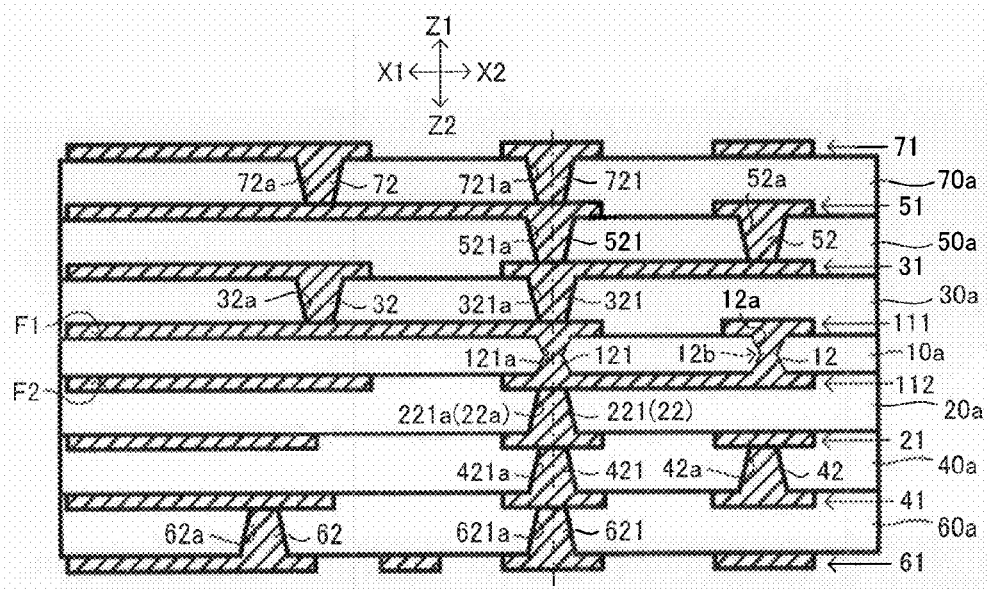
FIG. 18, in the manufacturing method of a wiring board shown in FIG. 11, is a view illustrating a step for forming a third tier of a laminated section.

As shown in FIG. 18, for example, a set of an interlayer insulation layer and a conductive layer is formed as a third tier for each of laminated sections (B1, B2). Third tiers of laminated sections (B1, B2) are formed the same as the first tiers of laminated sections (B1, B2), for example, namely, by laminating insulation layers and metal foils (such as copper foil with resin), pressing, curing resin, forming via holes (laser irradiation), forming via conductors and forming conductive layers (including roughening treatments).

Accordingly, a set of insulation layer (60a) and conductive layer 61 is formed on insulation layer (40a) and conductive layer 41, and a set of insulation layer (70a) and conductive layer 71 is formed on insulation layer (50a) and conductive layer 51. Via conductors 62 (including via conductor 621 of stacked structure (S11) shown in FIG. 2) are formed in insulation layer (60a), and via conductors 72 (including via conductor 721 of stacked structure (S11) shown in FIG. 2) are formed in insulation layer (70a).

When forming via holes (621a, 721a), due to irregular reflection of laser light at recess (521e) or (421e) (see FIG. 14), for example, via hole (721a) with a greater width than the width of via hole (521a) is formed, as well as via hole (621a) with a greater width than the width of via hole (421a) (see FIG. 2). In the present embodiment, axes in direction Z substantially correspond to each other in via holes (421a, 521a, 621a, 721a).

When forming via conductors (621, 721), recess (721e) deeper than recess (521e) is formed on a surface of land (721d) of via conductor 721, and recess (621e) deeper than recess (421e) is formed on a surface of land (621d) of via conductor 621.

Conductive layers (61, 71) may be patterned not by etching, but by pattern plating using plating resist.

In steps (S107)~(S109) of FIG. 11, fourth tiers of laminated sections (B1, B2) are formed, as well as a through hole that penetrates through the core substrate and the entire layer of laminated sections (B1, B2).

Figure 19:
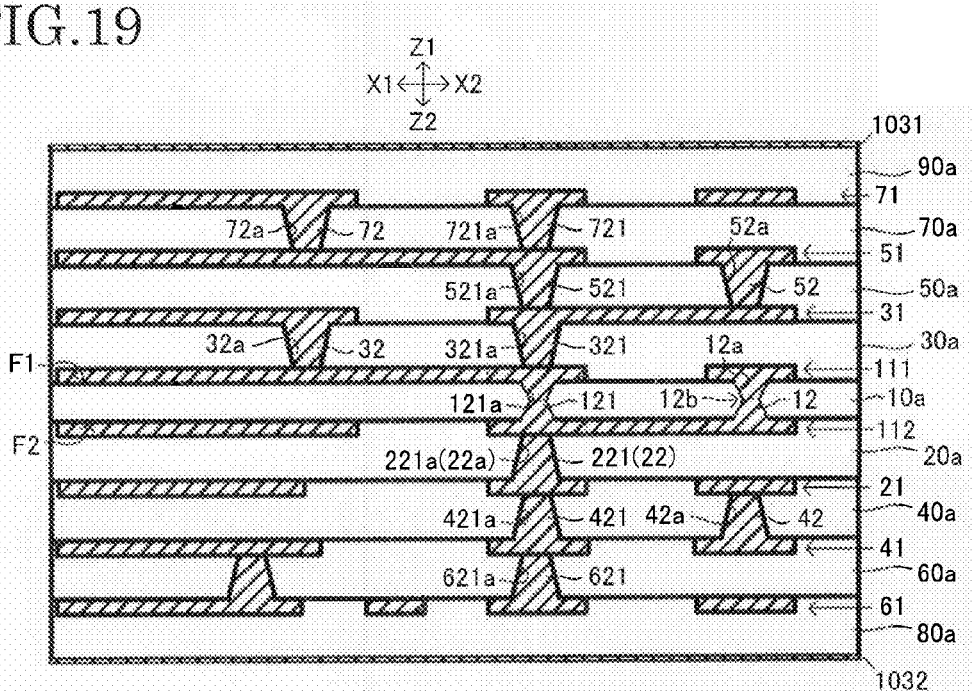
FIG. 19, in the manufacturing method of a wiring board shown in FIG. 11, is a view illustrating a first step for forming a fourth tier and a through hole of the laminated section.

Specifically, in step (S107) of FIG. 11, as shown in FIG. 19, for example, insulation layer (90a) (outermost insulation layer) and metal foil 1031 (such as copper foil) are positioned in that order on insulation layer (70a) and conductive layer 71, while insulation layer (80a) (outermost insulation layer) and metal foil 1032 (such as copper foil) are positioned in that order on insulation layer (60a) and conductive layer 61. Hereinafter, a substrate where insulation layers (60a, 70a) and metal foils (1031, 1032) are laminated is referred to as a second laminate (see FIG. 19).

Insulation layers (70a, 80a) and metal foils (1031, 1032) may be prepared as copper foils with resin, for example. At this stage, insulation layers (70a, 80a) are each made of prepreg of thermosetting glass epoxy, for example. However, instead of using prepreg, ABF or the like may also be used.

Thermal pressing in direction Z is conducted on the second laminate. Pressing and thermal treatments are conducted simultaneously, for example. Prepreg (insulation layers (70a, 80a)) is cured by thermal pressing and members are adhered to each other. As a result, the second laminate becomes integrated. Here, pressing and thermal treatments may be divided into multiple procedures. Thermal treatments and pressing may be conducted separately, but it is more efficient if they are conducted simultaneously. Another thermal treatment for integration may be conducted separately.

Figure 20:
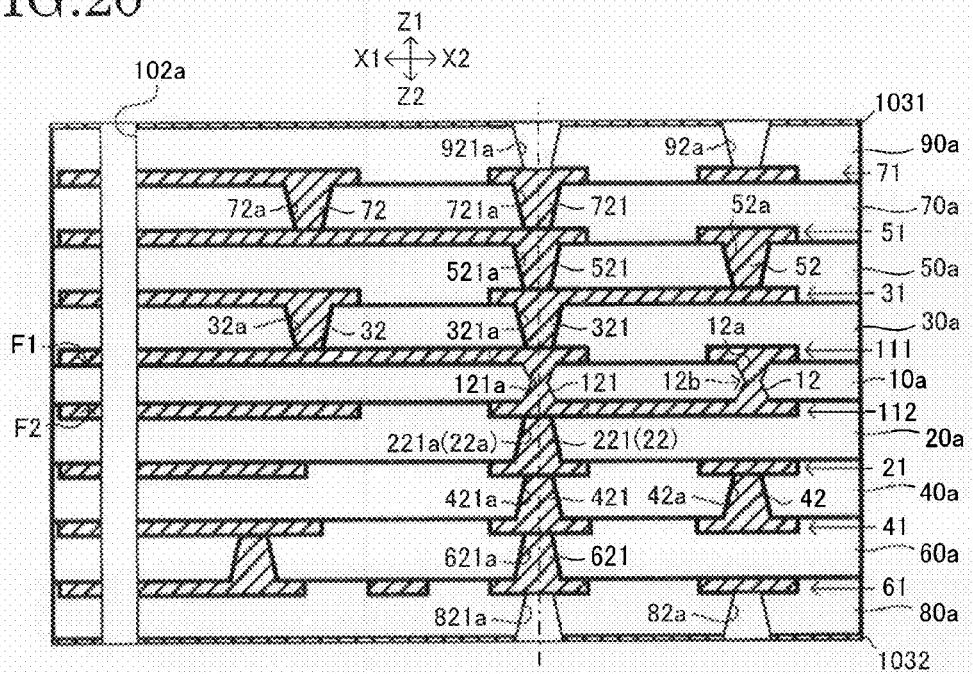
FIG. 20 is a view illustrating a second step subsequent to the step in FIG. 19.

In step (S108) of FIG. 11, a laser ($CO_2$ laser or the like) is used, for example, to form via holes (82a) penetrating through insulation layer (80a) (including via hole (821a) of stacked structure (S11) shown in FIG. 2), via holes (92a) penetrating through insulation layer (90a) (including via hole (921a) of stacked structure (S11) shown in FIG. 2), and through hole (102a) penetrating through the entire layer of the second laminate, as shown in FIG. 20. Here, black-oxide treatments are preferred to be conducted prior to forming holes (laser irradiation) depending on requirements. Also, desmearing and soft etching are conducted if required after the holes are formed.

During laser scanning, by increasing laser intensity (amount of laser light) to be irradiated on a spot for forming through hole (102a) compared with laser irradiation on spots for forming via holes (82a, 92a), via holes (82a, 92a) and through hole (102a) are formed by scanning once. Through hole (102a) may be formed by irradiating laser light only from one side of the second laminate, or by irradiating laser light from both sides of the second laminate at the same time. Alternatively, through hole (102a) may also be formed after a hole with a bottom (non-penetrating hole) is formed by irradiating laser light from one side of the second laminate, and then by irradiating laser light from the other side to penetrate through the bottom. Methods for forming through hole (102a) are not limited specifically, and through hole (102a) may be formed by using a drill or the like, separate from forming via holes (82a, 92a), for example.

When forming via holes (921a, 821a), due to irregular reflection of laser light at recess (721e) or (621e) (see FIG. 14), via hole (921a) with a greater width than the width of via hole (721a) is formed, as well as via hole (821a) with a greater width than the width of via hole (621a) (see FIG. 2). In the present embodiment, axes in direction Z substantially correspond to each other in via holes (621a, 721a, 821a, 921a).

Figure 21:
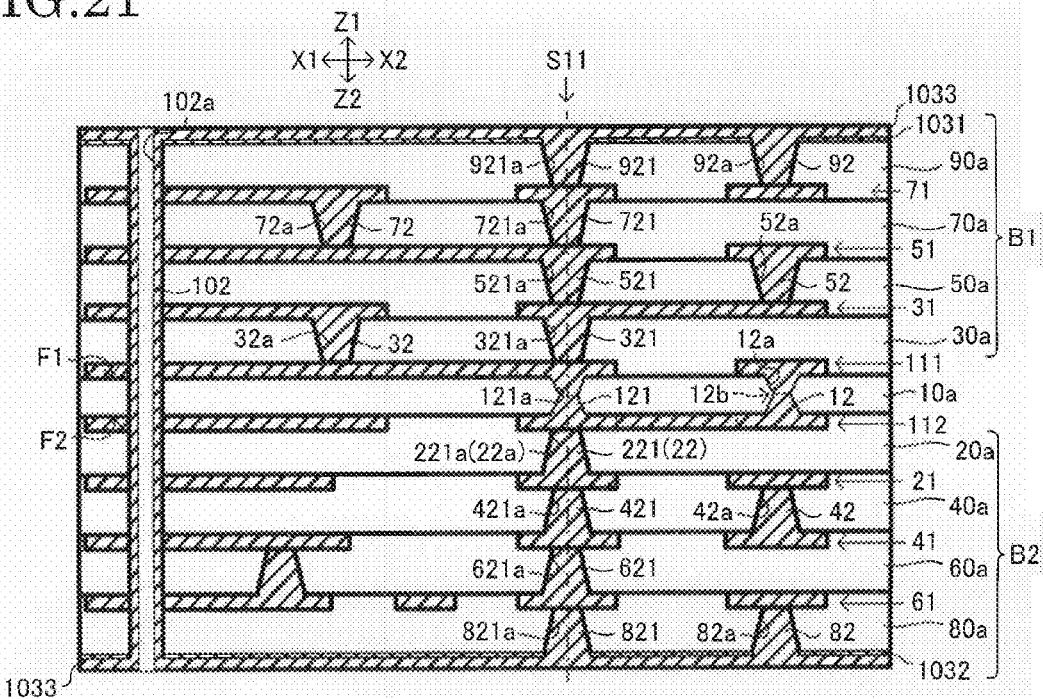
FIG. 21 is a view illustrating a third step subsequent to the step in FIG. 20.

In step (S109) of FIG. 11, using copper panel plating, for example, plating 1033 is formed on metal foil 1031, in via holes (82a), on metal foil 1032, in via holes (92a) and in through hole (102a), as shown in FIG. 21. Plating 1033 is formed by performing electroless plating to form electroless plated film and then by performing electrolytic plating using the electroless plated film as a seed layer, the same as in the step in FIG. 12C, for example. Accordingly, plating 1033 is filled in via holes (82a, 92a), and plating 1033 is formed on the wall surface of through hole (102a). As a result, via conductors (82, 92) and through-hole conductor 102 are formed.

When forming via conductors (82, 92), via conductor 821 with a greater width than the width of via conductor 621 as well as via conductor 921 with a greater width than the width of via conductor 721 is formed. In addition, recess (921e) deeper than recess (721e) is formed on a surface of land (921d) of via conductor 921, and recess (821e) deeper than recess (621e) is formed on a surface of land (821d) of via conductor 821. In the present embodiment, axes in direction Z substantially correspond to each other in through-hole conductor 121 and via conductors (221, 321, 421, 521, 621, 721, 821, 921).

Figure 22:
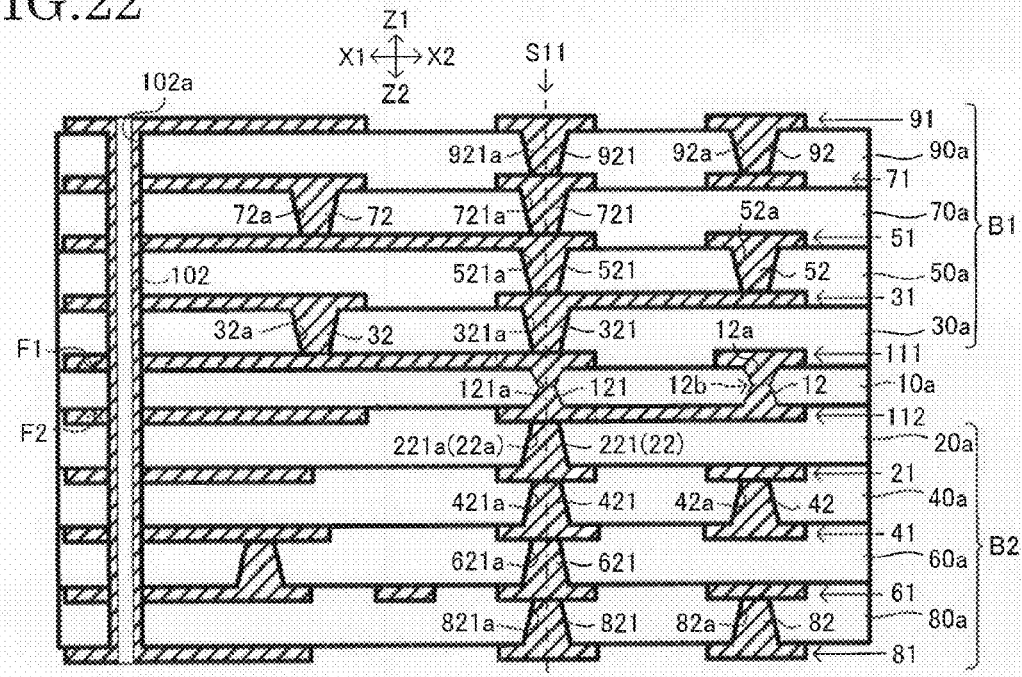
FIG. 22 is a view illustrating a fourth step subsequent to the step in FIG. 21.

As shown in FIG. 22, using a lithographic technique (etching resist, or the like), for example, conductive layers on insulation layers (80a, 90a) are patterned respectively. Accordingly, conductive layer 81 is formed on insulation layer (80a), and conductive layer 91 is formed on insulation layer (90a). Then, surfaces of conductive layers (81, 91) are roughened, depending on requirements.

Conductive layers (81, 91) may be patterned not by etching, but by pattern plating using plating resist.

In step (S110) of FIG. 11, solder resist 93 with opening portions (93a) is formed on insulation layer (90a) and conductive layer 91, and solder resist 83 with opening portions (83a) is formed on insulation layer (80a) and conductive layer 81 (see FIG. 1). Outermost conductive layers (81, 91) are covered respectively by solder resists (83, 93) except for predetermined portions positioned in opening portions (83a, 93a) (pads (P101, P102) or the like). Solder resists (83, 93) are each formed by screen printing, spray coating, roll coating, lamination or the like, for example.

By electrolytic plating, sputtering or the like, anticorrosion layers made of Ni/Au films, for example, are formed on conductive layers (81, 91), in particular, on surfaces of pads (P101, P102) (see FIG. 1) that are not covered by solder resists (83, 93) (see FIG. 9). Alternatively, anticorrosion layers made of organic protective film may also be formed by OSP treatments.

Wiring board 100 of the present embodiment (FIG. 1) is complete according to the steps above. Wiring board 100 of the present embodiment may be used as a circuit board for mobile equipment such as cell phones, for example. Another wiring board (such as a motherboard) may be electrically connected through soldering, for example, to pads (P101) of wiring board 100. Also, a flip-chip IC chip (bare chip) may be mounted through soldering, for example, on pads (P102) of wiring board 100.

According to the method for manufacturing a wiring board of the present embodiment, it is thought to be easier to form via conductors of stacked structure (S11) in such a way that the widths of via conductors increase as they come closer to outermost layers (via conductors (821, 921)) by using irregular reflection of laser light. As a result, it is easier to manufacture a wiring board having a stacked structure with high connection reliability.

The present invention is not limited to the above embodiment. For example, it may be modified as follows.

Figure 23:
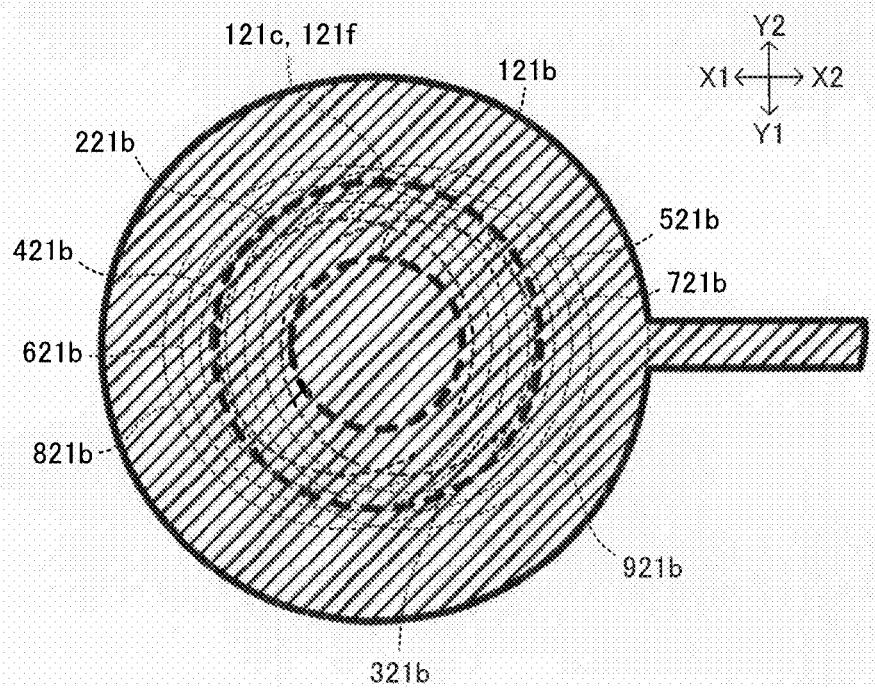
FIG. 23, in a stacked structure according to another embodiment of the present invention, is a view showing an example where bottom surfaces of the two via conductors stacked on both surfaces of a through-hole conductor are positioned by being shifted from each other when projected on a main surface of a wiring board (X-Y plane)

Bottom (221b) of via conductor 221 and bottom (321b) of via conductor 321 to be stacked on through-hole conductor 121 may be shifted from each other when projected on the X-Y plane. However, narrowed portion (121b) of through-hole conductor 121 is preferred to be included in the respective regions of bottom (221b) of via conductor 221 and bottom (321b) of via conductor 321, as shown in FIG. 23. In addition, bottom (221b) of via conductor 221 and bottom (321b) of via conductor 321 are both preferred to be included in the respective regions of end surfaces (121c, 121f) of through-hole conductor 121. According to such a structure, it is thought that electricity, heat or the like tends to travel easily between via conductor 221 and via conductor 321. Also, it is thought that stress on through-hole conductor 121 tends be suppressed.

Figure 24:
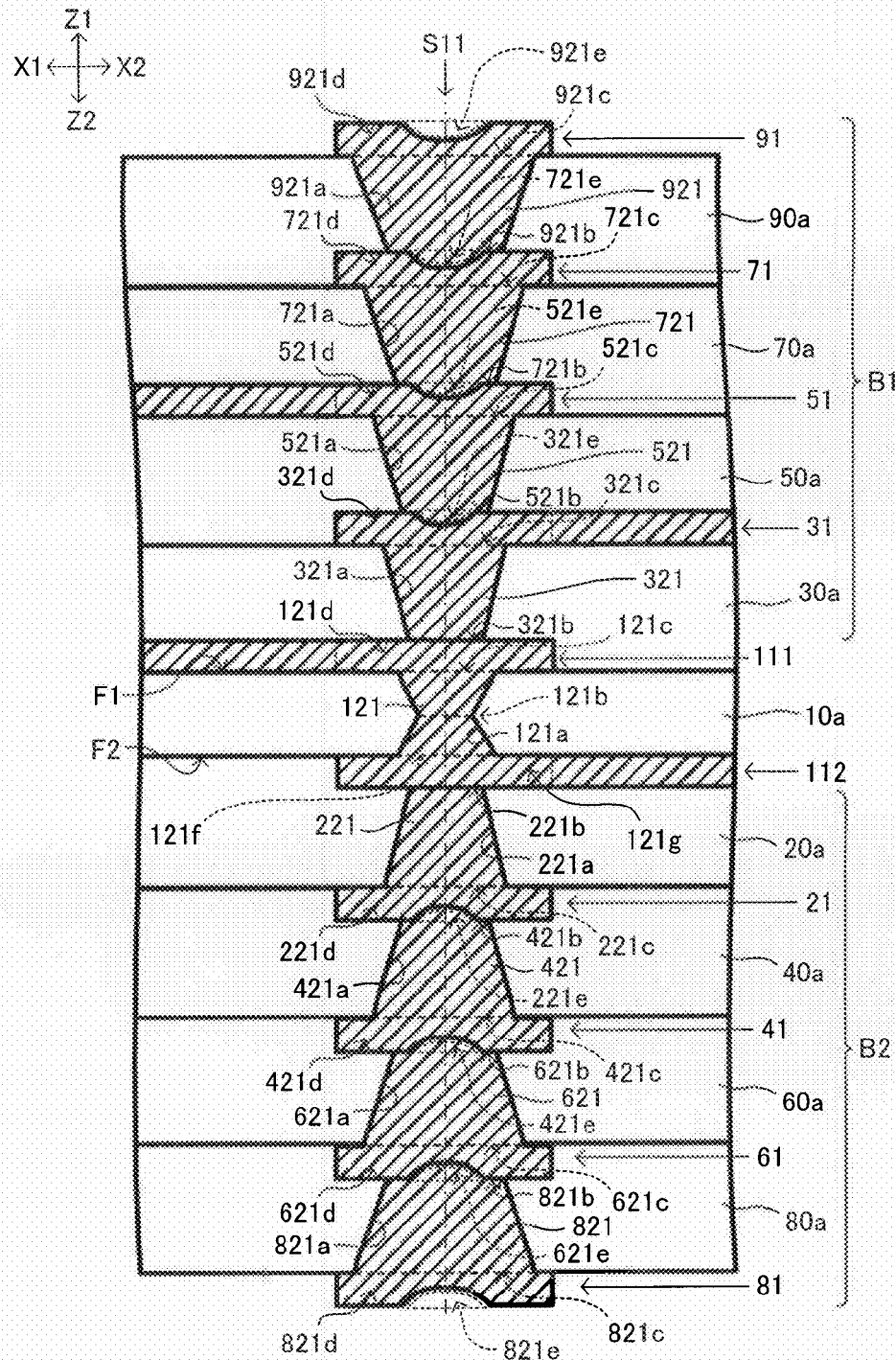
FIG. 24, in a stacked structure according to yet another embodiment of the present invention, is a view showing an example where no recess is formed on a land surface of the through-hole conductor formed in the core insulation layer.

A recess is not necessarily formed in a land of each through-hole conductor or each via conductor (especially, the through-hole conductor and via conductors of a stacked structure). For example, as shown in FIG. 24, it is an option not to form a recess on any surface of land (121*d*) or (121*f*) of through-hole conductor 121. By forming such a structure, it may be easier to adjust measurements of through-hole conductor 121 and via conductors (221, 321) to those described previously (D32>D11>D31, D22>D12>D21). Also, it is an option not to form a recess in any land of the through-hole conductor or via conductors of a stacked structure.

Land surfaces of the through-hole conductor and via conductors of a stacked structure (including surfaces inside recesses) may be roughened.

Figure 25:
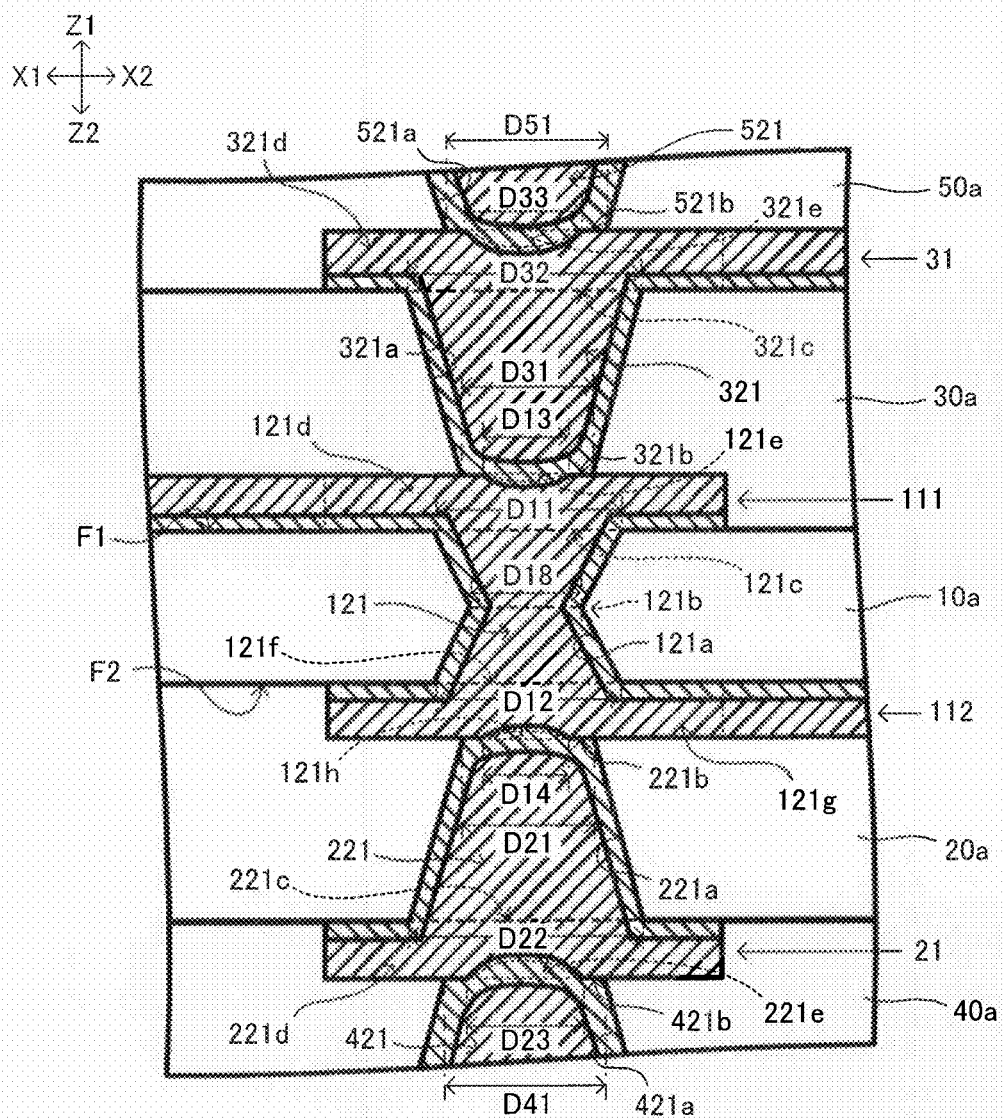
FIG. 25, in yet another embodiment of the present invention, is a view showing an example where each conductive layer of a wiring board does not contain metal foil and is formed only with plating.
Figure 26:
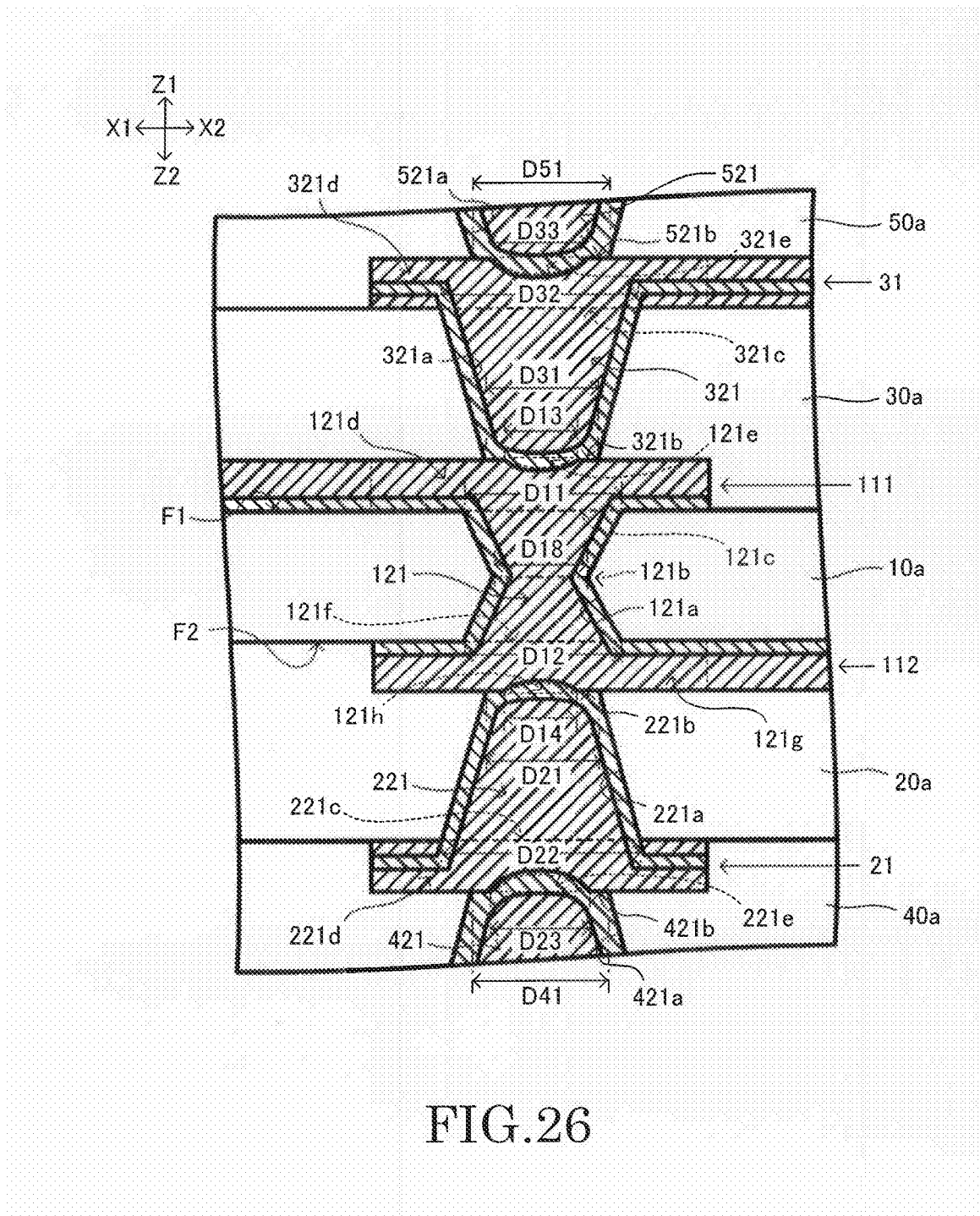
FIG. 26, in yet another embodiment of the present invention, is a view showing an example where some conductive layers of a wiring board contain metal foil while the other conductive layers of the wiring board do not contain metal foil.

As shown in FIG. 25 (view corresponding to FIG. 7), it is an option for each conductive layer of a wiring board to be formed only with plating (electroless plated film and electrolytic plating, for example) without containing metal foil. Alternatively, as shown in FIG. 26 (view corresponding to FIG. 7), for example, it is an option that some of the conductive layers of a wiring board (conductive layers (111, 112) on core insulation layer (10*a*), for example) do not contain metal foil, while the other conductive layers of the wiring board contain metal foil. Here, the layer structure of each conductive layer of a wiring board (the number of layers, thickness, material, or the like of each layer) is basically determined freely.

Methods for forming each conductive layer of a wiring board are not limited specifically. As for a method for forming each conductive layer, for example, any one or a combination of two or more of the following is effective: panel plating, pattern plating, full-additive, semi-additive (SAP), subtractive, transfer and tenting methods.

The planar shape (X-Y plane) of each through-hole conductor and each via conductor is not limited to a circle (complete round, ellipse, or the like), and may be in any other shape. The planar shape of each through-hole conductor and each via conductor may be substantially a square, or may be substantially a regular polygon such as substantially a regular hexagon or substantially a regular octagon, rather than substantially a square. The shapes of angles of a polygon are not limited specifically. For example, they may be substantially right angles, acute angles or obtuse angles, or may even be roundish. However, to prevent concentration of thermal stress, roundish angles are preferred.

Alternatively, the planar shape (X-Y plane) of each through-hole conductor and each via conductor may be substantially a rectangle, substantially a triangle, substantially a cross, or substantially a regular polygonal star, which is formed by drawing straight lines to radiate out from the center (shapes in which multiple spokes are positioned in a radial pattern).

Figure 27:
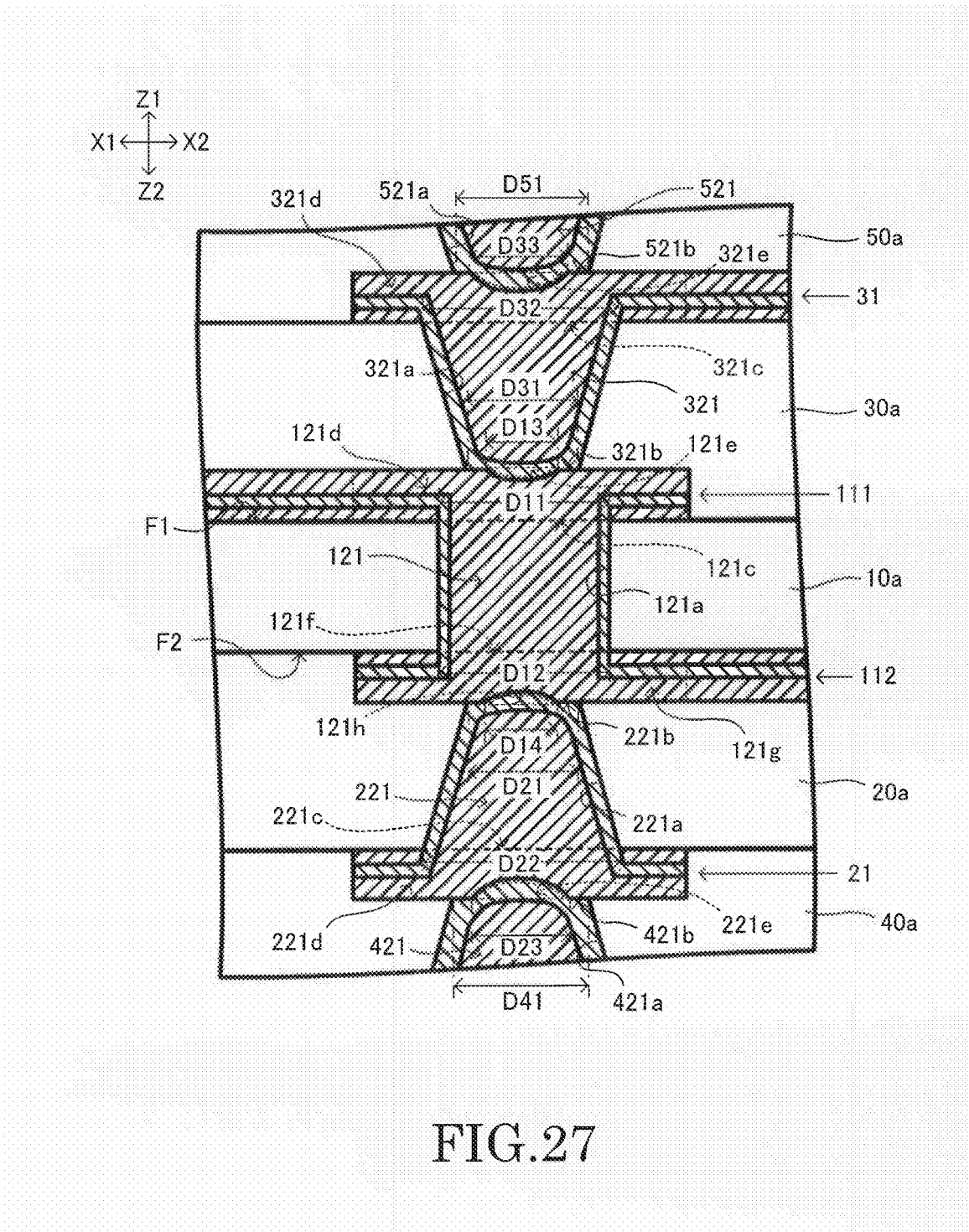
FIG. 27, in a stacked structure according to yet another embodiment of the present invention, is a view showing an example where a columnar through-hole conductor is formed in the core insulation layer.

The width of each through-hole conductor or each via conductor may or may not vary depending on its depth. For example, as shown in FIG. 27 (a view corresponding to FIG. 7), through-hole conductor 121 of a stacked structure may be a column having a constant width. In such a case as well, by setting through-hole conductor 121 and via conductors (221, 321) to have the measurements described above (measurements that satisfy at least either D32>D11>D31 or D22>D12>D21), greater strength or the like is thought to be easier to achieve. Alternatively, via conductors (especially the via conductors of a stacked structure) may have the same width as each other.

Figure 28:
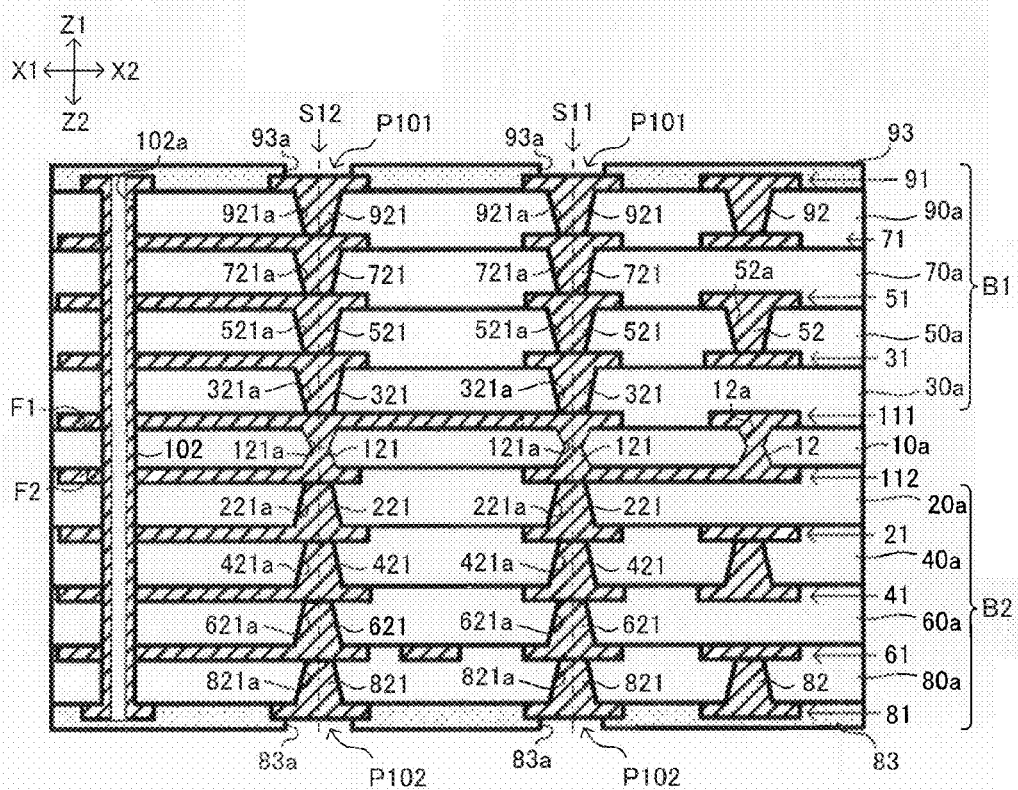
FIG. 28, in yet another embodiment of the present invention, is a view showing a wiring board having multiple full-stack structures.

It is an option for a wiring board to have multiple full-stack structures. For example, as shown in FIG. 28, a wiring board may have two full-stack structures (S11, S12). Stacked structure (S12) has the same structure as that of stacked structure (S11), for example (see FIG. 2).

Figure 29:
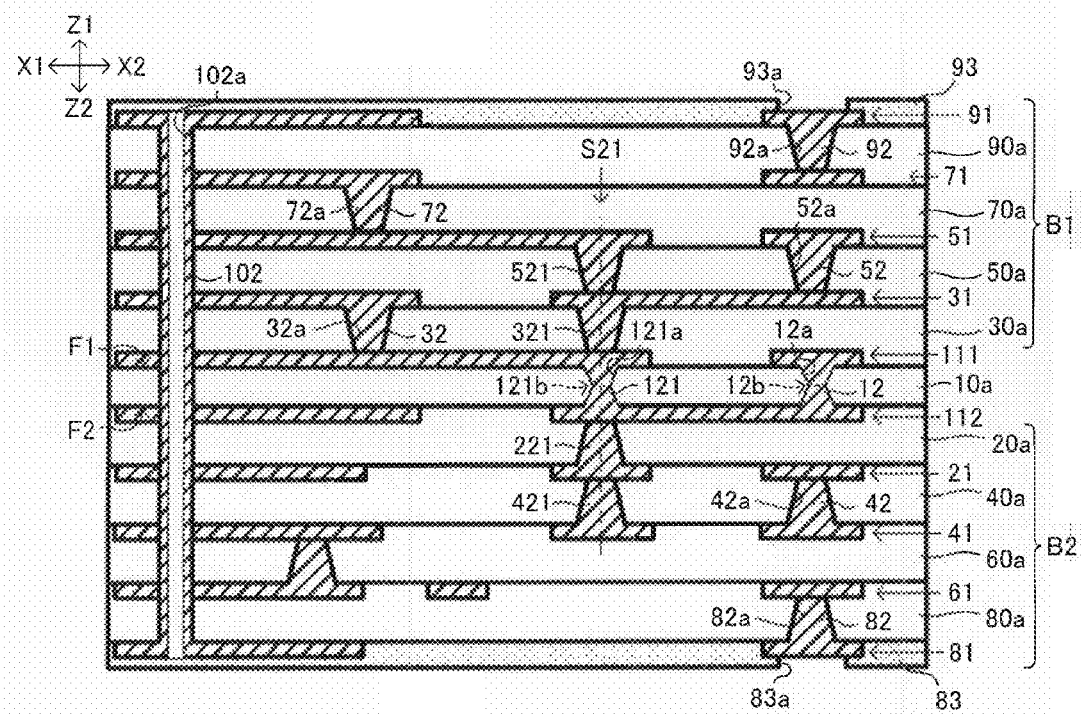
FIG. 29, in yet another embodiment of the present invention, is a view showing a wiring board with a stacked structure that is not a full stack.
Figure 30:
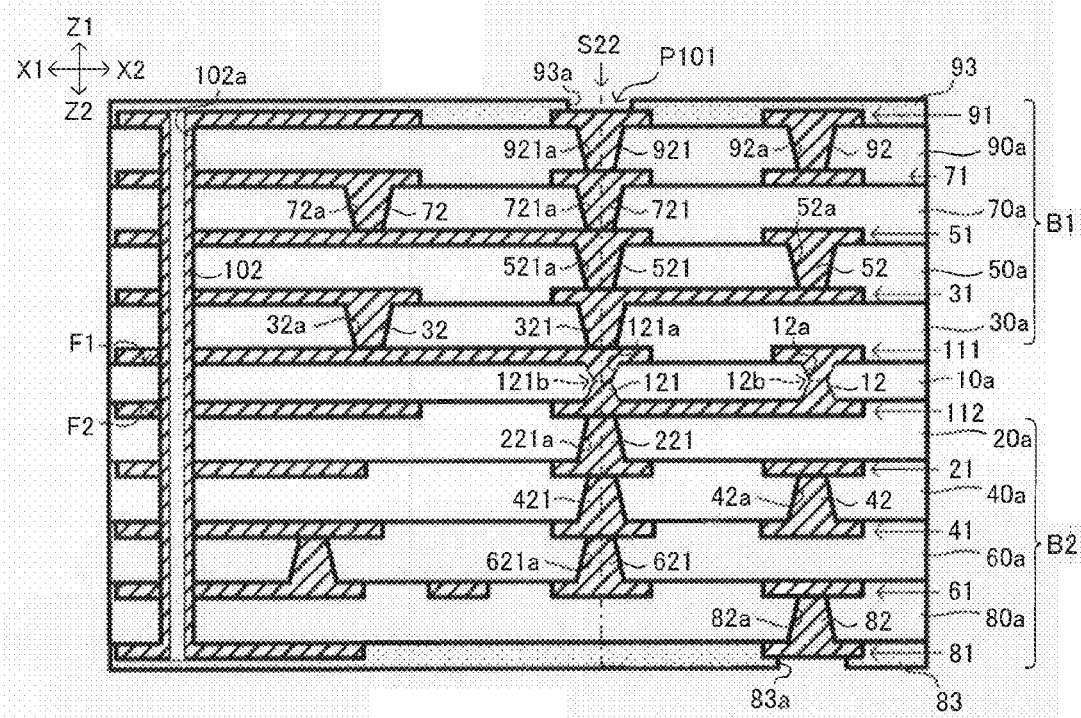
FIG. 30, in a stacked structure according to yet another embodiment of the present invention, is a view showing an example where the number of via conductors stacked on one side of a through-hole conductor is different from the number of via conductors stacked on the other side of the through-hole conductor.

In the above embodiment, stacked structure (S11) is set as a full stack: via conductors of a first stacked portion (first stacked structure) of stacked structure (S11) are formed in all the interlayer insulation layers that form laminated section (B1); and via conductors of a second stacked portion (second stacked structure) of stacked structure (S11) are formed in all the interlayer insulation layers that form laminated section (B2). However, that is not the only option. For example, as shown in FIG. 29, a wiring board may have stacked structure (S21) that is not a full stack. Alternatively, as shown in FIG. 30, for example, a wiring board may have stacked structure (S22) (asymmetrical stacked structure), where the number of via conductors stacked on one side of through-hole conductor 121 (the laminated section (B1) side, for example) is different from the number of via conductors stacked on the other side of through-hole conductor 121 (the laminated section (B2) side, for example).

A wiring board may have a built-in electronic component. In such a case, the number of electronic components to be built into a wiring board may be determined freely. Such an electronic device may be used as a circuit board of mobile equipment (cell phones or the like). Also, electronic components may be mounted on one surface (either on pads (P101) or (P102) shown in FIG. 1, for example) or both surfaces (both on pads (P101) and (P102) shown in FIG. 1, for example) of a wiring board. In such a case, the number of electronic components to be mounted on a surface of a wiring board is not limited specifically. Such an electronic device may be used as a circuit board of mobile equipment (cell phones or the like).

The structure of a wiring board, especially, the type, quality, measurements, material, shape, number of layers, position or the like of its elements may be modified freely within a scope that does not deviate from the gist of the present invention.

The method for manufacturing a wiring board is not limited to the order and contents shown in FIG. 11. The order and contents may be modified freely within a scope that does not deviate from the gist of the present invention. In addition, some step may be omitted depending on usage requirements or the like.

The above embodiments and modified examples may be combined freely. It is preferred to choose an appropriate combination according to usage requirements or the like. For example, any structure shown in FIGS. 23~27 may be applied to any stacked structure shown in FIGS. 28~30.

An embodiment of the present invention enhances the connection reliability of a stacked structure in a wiring board. Also, an embodiment of the present invention makes it easier to form high-density wiring in the inner layers of a wiring board while enhancing the strength of the outer layers of the wiring board. In addition, an embodiment of the present invention makes it easier to manufacture a wiring board having a stacked structure with high connection reliability.

A wiring board according to an embodiment of the present invention has the following: a core insulation layer having a first surface and an opposing second surface; a through-hole conductor formed in the core insulation layer; a first conductive layer formed on the first surface of the core insulation layer and including a first land of the through-hole conductor; and a first laminated section formed with at least a set of an interlayer insulation layer and a conductive layer, which is formed on the first surface of the core insulation layer and on the first conductive layer, along with a via conductor formed in the interlayer insulation layer. In such a wiring board, the through-hole conductor and the lowermost via conductor in the first laminated section stacked on the first land make up at least part of a stacked structure, and in such a stacked structure, the width of a first end surface of the through-hole conductor connected to the first land is set greater than the width of a bottom of the lowermost via conductor in the first laminated section and smaller than the width of an upper-end surface of the lowermost via conductor in the first laminated section.

A method for manufacturing a wiring board according to another embodiment of the present invention includes the following: preparing a core insulation layer having a first surface and an opposing second surface; forming a through-hole conductor in the core insulation layer; on the first surface of the core insulation layer, forming a first conductive layer that includes a first land of the through-hole conductor; on the first surface of the core insulation layer and on the first conductive layer, forming a first laminated section which is formed with at least a set of an interlayer insulation layer and a conductive layer; and forming a stacked structure, at least part of which is formed with the through-hole conductor and the lowermost via conductor in the first laminated section stacked on the first land. When forming such a stacked structure in the manufacturing method, the width of a first end surface of the through-hole conductor connected to the first land is set greater than the width of a bottom of the lowermost via conductor in the first laminated section and smaller than the width of an upper-end surface of the lowermost via conductor in the first laminated section.

Obviously, numerous modifications and variations of the present invention are possible in light of the above teachings. It is therefore to be understood that within the scope of the appended claims, the invention may be practiced otherwise than as specifically described herein.

What is claimed is:

1. A wiring board, comprising:
   a board structure comprising a core insulation layer, a first conductive layer formed on a first surface of the core insulation layer, a first laminated structure formed over the first surface of the core insulation layer and the first conductive layer, a second conductive layer formed on a second surface of the core insulation layer on an opposite side of the core insulation layer with respect to the first surface of the core insulation layer, and a second laminated structure formed over the second surface of the core insulation layer and the second conductive layer; and
   a stacked conductor structure formed in the board structure and comprising a through-hole conductor penetrating through the core insulation layer and a via conductor formed in the first laminated structure,
   wherein the through-hole conductor has a though-hole portion formed in a through hole penetrating through the core insulation layer and a first land portion formed on the first surface of the core insulation layer such that the through-hole portion has a first end portion, a second end portion and a narrowed portion formed between the first end portion and the second end portion, the first conductive layer includes the first land portion of the through-hole conductor, the first laminated structure includes an interlayer insulation layer in which the via conductor is formed, the via conductor in the first laminated structure is stacked on the first land portion of the through-hole conductor such that the stacked conductor structure comprising the through-hole conductor and the via conductor is formed through the core insulation layer and the interlayer insulation layer of the first laminated structure, the stacked conductor structure is formed such that the through-hole portion of the through-hole conductor has the first end portion connected to the first land portion of the through-hole conductor, that the first end portion of the through-hole portion has a width which is set greater than a width of a bottom surface of the via conductor connected to the first land portion of the through-hole conductor and smaller than a width of a top surface of the via conductor in the first laminated structure and that the narrowed portion has a width which is set smaller than the width of the bottom surface of the via conductor connected to the first land portion of the through-hole conductor, the stacked conductor structure comprises a plating material filling the through hole in the core insulation layer, the second laminated structure comprises an interlayer insulation layer and a via conductor formed in the interlayer insulation layer of the second laminated structure, the through-hole conductor has a second land portion formed on the second surface of the core insulation layer and connected to the second end portion of the through-hole portion, the second conductive layer includes the second land portion of the through-hole conductor, the through-hole portion of the through-hole conductor becomes narrower from the first end portion toward the narrowed portion and from the second end portion toward the narrowed portion, the stacked conductor structure includes the through-hole conductor, the via conductor in the first laminated structure stacked on the first land portion of the through-hole conductor, and the via conductor in the second laminated structure stacked on the second land portion of the through-hole conductor such that the narrowed portion has the width which is set smaller than the width of the bottom surface of the via conductor connected to the second land portion of the through-hole conductor, and the second end portion of the through-hole conductor has a width which is set greater than the width of the bottom surface of the via conductor connected to the second land portion of the through-hole structure and smaller than a width of a top surface of the via conductor connected to the second land portion of the through-hole structure.

2. The wiring board according to claim 1, wherein the stacked conductor structure includes a first stacked portion stacked on the first land portion of the through-hole conductor and a second stacked portion stacked on the second land portion of the through-hole conductor, the first stacked portion includes at least four stacked via conductors including the via conductor in the first laminated structure, and the second stacked portion includes at least four stacked via conductors including the via conductor in the second laminated structure.

3. The wiring board according to claim 1, wherein the first laminated structure includes a plurality of insulation layers and a plurality of stacked via conductors formed in the plurality of insulation layers, respectively, the stacked conductor structure includes the plurality of stacked via conductors, the plurality of insulation layers have substantially a same thickness, and the first land portion of the through-hole conductor has a recess portion on which the bottom surface of the via conductor is formed.

4. The wiring board according to claim 1, wherein the first laminated structure includes a plurality of insulation layers comprising a core material and a resin material impregnating the core material and a plurality of stacked via conductors formed in the plurality of insulation layers, respectively, and the stacked conductor structure includes the plurality of stacked via conductors.

5. The wiring board according to claim 1, wherein the stacked conductor structure comprises a second plating material filling a via hole formed through the interlayer insulation layer in the first laminated structure.

6. The wiring board according to claim 1, wherein the stacked conductor structure comprises the plating material filling a via hole formed through the interlayer insulation layer in the first laminated structure.

7. The wiring board according to claim 1, wherein the first laminated structure includes a plurality of insulation layers and a plurality of stacked via conductors formed in the plurality of insulation layers, respectively, and the stacked conductor structure includes the plurality of stacked via conductors.

8. The wiring board according to claim 7, wherein the first laminated structure includes a plurality of insulation layers and a plurality of stacked via conductors formed in the plurality of insulation layers, respectively, the stacked conductor structure includes the plurality of stacked via conductors, and the stacked conductor structure is formed such that the width of the first end portion of the through-hole portion is set greater than a width of a bottom surface of each of the stacked via conductors and smaller than a width of a top surface of each of the stacked via conductors.

9. The wiring board according to claim 1, wherein the stacked conductor structure comprises a plating material filling the through hole in the core insulation layer, a plating material filling a via hole formed through the interlayer insulation layer in the first laminated structure, and a plating material filling a via hole formed through the interlayer insulation layer in the second laminated structure.

10. A method for manufacturing a wiring board, comprising:
forming a through hole penetrating through a core insulation layer;
forming a through-hole portion of a through-hole conductor in the through hole of the core insulation layer such that the through-hole portion has a first end portion, a second end portion and a narrowed portion formed between the first end portion and the second end portion;
forming on a first surface of the core insulation layer a first conductive layer including a first land portion of the through-hole conductor;
forming over the first surface of the core insulation layer and the first conductive layer a first laminated structure comprising an interlayer insulation layer;
forming a via conductor in the interlayer insulation layer of the first laminated structure such that the via conductor is stacked on the first land portion of the through-hole conductor and forms a stacked conductor structure comprising the through-hole conductor penetrating through the core insulation layer and the via conductor in the interlayer insulation layer of the first laminated structure;
forming a second conductive layer on a second surface of the core insulation layer on an opposite side of the core insulation layer with respect to the first surface of the core insulation layer such that the second conductive layer includes a second land portion of the through-hole conductor; and
forming a second laminated structure over the second surface of the core insulation layer and the second conductive layer,
wherein the stacked conductor structure is formed such that the through-hole portion of the through-hole conductor has the first end portion connected to the first land portion of the through-hole conductor, that the first end portion of the through-hole portion has a width which is set greater than a width of a bottom surface of the via conductor connected to the first land portion of the through-hole conductor and smaller than a width of a top surface of the via conductor in the first laminated structure and that the narrowed portion has a width which is set smaller than the width of the bottom surface of the via conductor connected to the first land portion of the through-hole conductor, the forming of the through-hole portion comprises filling the through hole in the core insulation layer with a plating material, the stacked conductor structure is formed such that the through-hole conductor has the second end portion connected to the second land portion of the through-hole conductor and that the through-hole portion of the through-hole conductor becomes narrower from the first end portion toward the narrowed portion and from the second end portion toward the narrowed portion, the second laminated structure includes an interlayer insulation layer and a via conductor formed in the interlayer insulation layer of the second laminated structure, the stacked conductor structure is formed such that the stacked conductor structure includes the through-hole conductor, the via conductor in the first laminated structure stacked on the first land portion of the through-hole conductor, and the via conductor in the second laminated structure stacked on the second land portion of the through-hole conductor such that the narrowed portion has the width which is set smaller than the width of the bottom surface of the via conductor connected to the second land portion of the through-hole conductor, and the second end portion of the through-hole conductor has a width which is set greater than the width of the bottom surface of the via conductor connected to the second land portion of the through-hole structure and smaller than a width of a top surface of the via conductor connected to the second land portion of the through-hole structure.

11. The method for manufacturing a wiring board according to claim 10, wherein the forming of the via conductor includes irradiating laser upon the interlayer insulation layer such that a via hole is formed through the interlayer insulation layer and filling the via hole with a plating material.

12. The method for manufacturing a wiring board according to claim 11, further comprising forming a second via conductor in the first laminated structure such that the second via conductor is stacked on the via conductor, wherein the forming of the first laminated structure includes forming a second interlayer insulation layer over the interlayer insulation layer, and the forming of the second via conductor includes irradiating laser upon the second interlayer insulation layer such that a second via hole is formed through the second interlayer insulation layer and filling the second via hole with a plating material.

13. The wiring board according to claim 1, wherein the first land portion of the through-hole conductor has a recess portion on which the bottom surface of the via conductor is formed.

14. The wiring board according to claim 5, wherein the first laminated structure includes a plurality of insulation layers and a plurality of stacked via conductors formed in the plurality of insulation layers, respectively, the stacked conductor structure includes the plurality of stacked via conductors, the plurality of insulation layers have substantially a same thickness, and the first land portion of the through-hole conductor has a recess portion on which the bottom surface of the via conductor is formed.

15. The wiring board according to claim 5, wherein the first laminated structure includes a plurality of insulation layers comprising a core material and a resin material impregnating the core material and a plurality of stacked via conductors formed in the plurality of insulation layers, respectively, and the stacked conductor structure includes the plurality of stacked via conductors.

16. A wiring board, comprising:
a board structure comprising a core insulation layer, a first conductive layer formed on a first surface of the core insulation layer, a first laminated structure formed over the first surface of the core insulation layer and the first conductive layer, a second conductive layer formed on a second surface of the core insulation layer on an opposite side of the core insulation layer with respect to the first surface of the core insulation layer, and a second laminated structure formed over the second surface of the core insulation layer and the second conductive layer; and
a stacked conductor structure formed in the board structure and comprising a through-hole conductor penetrating through the core insulation layer and a via conductor formed in the first laminated structure,
wherein the through-hole conductor has a though-hole portion formed in a through hole penetrating through the core insulation layer and a first land portion formed on the first surface of the core insulation layer such that the through-hole portion has a first end portion, a second end portion and a narrowed portion formed between the first end portion and the second end portion, the first conductive layer includes the first land portion of the through-hole conductor, the first laminated structure includes an interlayer insulation layer in which the via conductor is formed, the via conductor in the first laminated structure is stacked on the first land portion of the through-hole conductor such that the stacked conductor structure comprising the through-hole conductor and the via conductor is formed through the core insulation layer and the interlayer insulation layer of the first laminated structure, the stacked conductor structure is formed such that the through-hole portion of the through-hole conductor has the first end portion connected to the first land portion of the through-hole conductor, that the first end portion of the through-hole portion has a width which is set greater than a width of a bottom surface of the via conductor connected to the first land portion of the through-hole conductor and smaller than a width of a top surface of the via conductor in the first laminated structure and that the narrowed portion has a width which is set smaller than the width of the bottom surface of the via conductor connected to the first land portion of the through-hole conductor, the stacked conductor structure comprises a plating material filling the through hole in the core insulation layer, the second laminated structure comprises an interlayer insulation layer and a via conductor formed in the interlayer insulation layer of the second laminated structure, the through-hole conductor has a second land portion formed on the second surface of the core insulation layer and connected to the second end portion of the through-hole portion, the second conductive layer includes the second land portion of the through-hole conductor, the through-hole portion of the through-hole conductor becomes narrower from the first end portion toward the narrowed portion and from the second end portion toward the narrowed portion, the stacked conductor structure includes the through-hole conductor, the via conductor in the first laminated structure stacked on the first land portion of the through-hole conductor, and the via conductor in the second laminated structure stacked on the second land portion of the through-hole conductor such that the narrowed portion has the width which is set smaller than the width of the bottom surface of the via conductor connected to the second land portion of the through-hole conductor, the stacked conductor structure includes a first stacked portion stacked on the first land portion of the through-hole conductor and a second stacked portion stacked on the second land portion of the through-hole conductor, the first stacked portion includes at least four stacked via conductors including the via conductor in the first laminated structure, and the second stacked portion includes at least four stacked via conductors including the via conductor in the second laminated structure.

17. The wiring board according to claim 16, wherein the stacked conductor structure comprises a second plating material filling a via hole formed through the interlayer insulation layer in the first laminated structure.

18. The wiring board according to claim 16, wherein the stacked conductor structure comprises the plating material filling a via hole formed through the interlayer insulation layer in the first laminated structure.

19. The wiring board according to claim 16, wherein the first laminated structure includes a plurality of insulation layers and a plurality of stacked via conductors formed in the plurality of insulation layers, respectively, and the stacked conductor structure includes the plurality of stacked via conductors.

20. The wiring board according to claim 16, wherein the stacked conductor structure comprises a plating material filling the through hole in the core insulation layer, a plating material filling a via hole formed through the interlayer insulation layer in the first laminated structure, and a plating material filling a via hole formed through the interlayer insulation layer in the second laminated structure.

* * * * *